United States Patent
Okumura et al.

(10) Patent No.: US 7,149,207 B2
(45) Date of Patent: *Dec. 12, 2006

(54) DATA MULTIPLEXING METHOD AND DATA MULTIPLEXER, AND DATA TRANSMITTING METHOD AND DATA TRANSMITTER

(75) Inventors: Yukihiko Okumura, Yokohama (JP); Hidehiro Ando, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/226,218

(22) Filed: Sep. 15, 2005

(65) Prior Publication Data

US 2006/0007950 A1  Jan. 12, 2006

Related U.S. Application Data

(63) Continuation of application No. 09/720,260, filed as application No. PCT/JP00/02962 on May 9, 2000, now Pat. No. 6,956,842.

(30) Foreign Application Priority Data

May 10, 1999  (JP) ................... 11-129056

(51) Int. Cl.
*H04J 3/06* (2006.01)
(52) U.S. Cl. ............... 370/350; 370/500; 370/537
(58) Field of Classification Search ........... 370/310, 370/345, 349, 350, 464, 498, 500, 535, 537, 370/540; 455/39, 72; 714/761, 762–776, 714/788
See application file for complete search history.

(56) References Cited

U.S. PATENT DOCUMENTS

| | | | |
|---|---|---|---|
| 3,652,998 A | | 3/1972 | Forney, Jr. |
| 4,637,017 A | * | 1/1987 | Assal et al. ............ 370/318 |
| 5,392,299 A | | 2/1995 | Rhines et al. |
| 5,463,641 A | | 10/1995 | Dorward et al. |
| 5,535,239 A | * | 7/1996 | Padovani et al. ........ 370/209 |
| 5,689,568 A | * | 11/1997 | Laborde ................. 713/151 |
| 5,745,582 A | | 4/1998 | Shimpuku et al. |

(Continued)

FOREIGN PATENT DOCUMENTS

EP    0 715 440    6/1996

(Continued)

OTHER PUBLICATIONS

3GPP: TS 25 212, Version 1.0.0, Internet Article XP-002245691, pp. 1-38, 3rd Generation Partnership Project (3GPP); Technical Specification Group (TSG); Radio Access Network (RAN); Working Group 1 (WG1); Multiplexing and Channel Coding (FDD), Apr. 1999.

(Continued)

*Primary Examiner*—Dmitry Levitan
(74) *Attorney, Agent, or Firm*—Oblon, Spivak, McClelland, Maier & Neustadt, P.C.

(57) ABSTRACT

An effective data multiplexing method wherein an error correction ability is exerted at the maximum so that data transmission quality is improved and a data transmitting method in which an interleaving process applicable to data transmission using interpolation pilot signal is performed are provided. The data multiplexing method includes the steps of: coding input data for each input channel; multiplexing said data which is coded; performing an interleaving process on said data which is multiplexed; and outputting said data. In the data transmitting method, when an interleaving process is performed, an interleaver is used in which the number of columns of the interleaver is twice as many as the number of slots of a frame.

8 Claims, 28 Drawing Sheets

U.S. PATENT DOCUMENTS

| | | | |
|---|---|---|---|
| 5,799,033 | A | 8/1998 | Baggen |
| 5,850,393 | A | 12/1998 | Adachi |
| 5,896,374 | A | 4/1999 | Okumura et al. |
| 5,987,023 | A * | 11/1999 | Albrow et al. ............... 370/350 |
| 6,097,711 | A | 8/2000 | Okawa et al. |
| 6,151,312 | A * | 11/2000 | Evans et al. ................. 370/338 |
| 6,357,029 | B1 | 3/2002 | Sinha et al. |
| 6,396,826 | B1 * | 5/2002 | Ohlson et al. ............... 370/342 |
| 6,631,491 | B1 | 10/2003 | Shibutani et al. |
| 2006/0007873 | A1 | 1/2006 | Okumura et al. |
| 2006/0007949 | A1 | 1/2006 | Okumura et al. |
| 2006/0007950 | A1 | 1/2006 | Okumura et al. |

FOREIGN PATENT DOCUMENTS

| | | |
|---|---|---|
| EP | 0 928 116 | 7/1999 |
| JP | WO 96/26582 | 8/1996 |
| JP | 9-191276 | 7/1997 |
| JP | 9-298519 | 11/1997 |
| JP | 11-196072 | 7/1999 |
| WO | WO 97/14235 | 4/1997 |
| WO | WO 98/47253 | 10/1998 |
| WO | WO 98/51028 | 11/1998 |

OTHER PUBLICATIONS

E. Okamoto et al, Universal Personal Communications, XP 010315029, pp. 921-924, "A Pilot Symbol Assisted Compensation Scheme of Fading and Frequency Ofset for 16QAM", Oct. 5, 1998.

J. K. Cavers, IEEE Transactions on Vehicular Technology, vol. 40, No. 4, XP-000278280, pp. 686-693, "An Analysis of Pilot Symbol Assisted Modulation for Rayleigh Fading Channels", Nov. 1, 1991.

H. Kong, et al, IEEE Transactions on Vehicular Technology, vol. 47, No. 2, XP-002245847, pp. 558-565, "On Channel Estimation and Sequence Detection of Interleaved Coded Signals Over Frequency Nonselective, Rayleigh Fading Channels", May 1998.

C. Il Bang et al., IEEE Transactions on Consumer Electronics, vol. 41, No. 4, XP-000553491, pp. 1138-1141, "An Analysis of Pilot Symbol Assisted 16 QAM in the Rayleigh Fading Channel", Nov. 1, 1995.

A Shibutani et al, p. 488, "Multiple Interleaving Methods for the W-CDMA System", 1998 (with English translation).

* cited by examiner

FIG. 6

| INTERLEAVING SPAN | NUMBER OF COLUMN | COLUMN RANDOMIZING PATTERN |
|---|---|---|
| 10ms | 1 | $C_0$ |
| 20ms | 2 | $C_0, C_1$ |
| 40ms | 4 | $C_0, C_2, C_1, C_3$ |
| 80ms | 8 | $C_0, C_4, C_2, C_6, C_1, C_5, C_3, C_7$ |

FIG. 11

| NUMBER OF COLUMN | INTERLEAVE PATTERN |
|---|---|
| 2 | 0,1 |
| 3 | 0,1,2 |
| 4 | 0,2,1,3 |
| 5 | 0,3,1,4,2 |
| 6 | 0,2,4,1,3,5 |
| 7 | 0,3,6,2,5,1,4 |
| 8 | 0,4,2,6,1,5,3,7 |
| 9 | 0,3,6,1,4,7,2,5,8 |
| 10 | 0,4,8,2,6,1,5,9,3,7 |
| 11 | 0,5,10,2,7,4,9,1,6,3,8 |
| 13 | 0,9,3,12,6,2,11,5,8,1,10,4,7 |
| 15 | 0,9,3,12,6,1,10,4,13,7,2,11,5,14,8 |
| 16 | 0,8,4,12,2,10,6,14,1,9,5,13,3,11,7,15 |
| 17 | 0,10,5,15,2,7,12,4,9,14,1,6,11,16,3,8,13 |
| 20 | 0,10,5,15,2,12,7,17,4,14,9,19,1,11,6,16,3,13,8,18 |
| 30 | 0,10,20,5,15,25,3,13,23,8,18,28,1,11,21,6,16,26,4,14,24,9,19,29,2,12,22,7,17,27 |
| 32 | 0,16,8,24,4,20,12,28,2,18,10,26,6,22,14,30,1,17,9,25,5,21,13,29,3,19,11,27,7,23,15,31 |
| 64 | 0,32,16,48,8,40,24,56,4,36,20,52,12,44,28,60,2,34,18,50,10,42,26,58,6,38,22,54,14,46,30,62,1,33,17,49,9,41,25,57,5,37,21,53,13,45,29,61,3,35,19,51,11,43,27,59,7,39,23,55,15,47,31,63 |
| 128 | 0,64,32,96,16,80,48,112,8,72,40,104,24,88,56,120,4,68,36,100,20,84,52,116,12,76,44,108,28,92,60,124,2,66,34,98,18,82,50,114,10,74,42,106,26,90,58,122,6,70,38,102,22,86,54,118,14,78,46,110,30,94,62,126,1,65,33,97,17,81,49,113,9,73,41,105,25,89,57,121,5,69,37,101,21,85,53,117,13,77,45,109,29,93,61,125,3,67,35,99,19,83,51,115,11,75,43,107,27,91,59,123,7,71,39,103,23,87,55,119,15,79,47,111,31,95,63,127 |

|  |  | × × | | | | | ○ ○ | | | ← BIT QUALITY |
|---|---|---|---|---|---|---|---|---|---|---|
| Slot | 1 | 1 | 31 | 61 | ・・・ | 271 | 11 | 41 | ・・・ | 281 |
|  | 2 | 21 | | | | | 5 | | | |
|  | 3 | 15 | | | | | 25 | | | |
|  | 4 | 9 | | | | | 19 | | | |
|  | 5 | 29 | | | | | 3 | | | |
|  | 6 | 13 | | | | | 23 | | | |
|  | ・ | ・ | | | | | ・ | | | |
|  | ・ | ・ | | | | | ・ | | | |
|  | ・ | ・ | | | | | ・ | | | |
|  | 15 | 18 | | | | | 28 | | | |

(a) ・・・ × ○ ○ × ○ × × ○ × ○ ○ ・・・
        1 2 3 4 5 6 7 8 9 10 11

⟹ ○, × REPEAT EVERY 1BIT ~ 2BITS

FIG. 28

DATA MULTIPLEXING METHOD AND DATA MULTIPLEXER, AND DATA TRANSMITTING METHOD AND DATA TRANSMITTER

CROSS REFERENCE TO RELATED APPLICATION

This application is a continuation of parent application Ser. No. 09/720,260, filed Feb. 26, 2001, now U.S. Pat. No. 6,956,842 the entire contents of which are incorporated herein by reference.

TECHNICAL FIELD

The present invention relates to an interleaving technique for improving an ability of error correcting code against a burst error. More particularly, the present invention relates a method and an apparatus for multiplexing channels by using an interleaving method in which randomness of data is increased so that an effect of interleaving is improved.

In addition, the present invention relates to a data transmitting method which is used applicably in combination with a data receiving method of performing synchronous detection by using an interpolation pilot signal.

BACKGROUND ART

In a digital transmission of a mobile communication system and the like, due to a multipath fading caused by reflection by a building and the like, the level of a receiving signal changes by large amounts temporally so that code errors such as burst errors occur. Thus, various error correcting codes are used. In the error correcting codes, an interleaving technique is used for improving correcting ability for the burst error. The proprieties of the interleaving technique determines the ability of the error correcting code for the burst error.

As is known to a person skilled in the art, the object of the interleaving method is to randomize a sequence of input bit series and a sequence of output bit sequence. FIG. 1 shows an example of the interleaving method according to a conventional technique. In this figure, an example is shown in which interleaving process is performed to data 101 of one frame which is configured by 1152 bits. An array 110 has a buffer of N×M (N rows and M columns). The interleaving process is realized such that, for example, 16 bits are written to this buffer in the row direction like a row vector 115 which is indicated by a diagonally shaded area A and 72 bits are read out in the column direction like a column vector 120 which is indicated by a diagonally shaded area B.

By the way, it is becoming required that various apparatuses in the mobile communication multiplex a plurality of channels for data transmission. FIG. 2 shows an example of a data multiplexer according to a conventional technique. The data multiplexer 30 includes channel coding parts 32, 34, transmission line interleavers 36, 38, frame segmenting parts 40, 42, a sub-block/multiplexing part 44 and a physical channel mapping part 46. The frame is assumed to be a fixed time length which is the same as the minimum interleaving span.

In the figure, the channel coding part 32, the transmission line interleaver 36 and the frame segmenting part 40 perform an interleaving process of a logical channel A and the channel coding part 34, the transmission line interleaver 38 and the frame segmenting part 42 perform an interleaving process of a logical channel B. The interleaving process is performed, for example, by the above-mentioned method.

The logical channel A has a coding block size $L_A$ and an interleaving span $I_A$. The logical channel B has a coding block size $L_B$ and an interleaving span $I_B$. The interleaving span $I_A$ is not necessarily the same as the interleaving span $I_B$. In each channel, each of the frame segmenting part 40, 42 performs segmentation for multiplexing after performing error correction and interleaving, then multiplexing is performed segment by segment. According to the configuration, the difference between interleaving spans of channels is absorbed. In addition, the sub-block/multiplexing part divides frame data of each channel into sub-blocks having proper size beforehand and multiplexes each channel data alternately by the sub-block such that bits of the two logical channels are distributed uniformly over frames as possible.

By the way, in the field of the mobile communication, since the mobile station moves at high velocity, it is necessary to keep stable operation even under an environment of a high fading pitch. Therefore, it is performed to send pilot signals which indicate reference phase of modulation in a predetermined cycle. An interval between a pilot signal and next pilot signal is called a slot in which data signals are placed. Then, a receiving side which receives signals configured by the slot obtains the reference phase in a slot interval by using interpolation based on a pilot signal in the head part of the slot and a pilot signal in the end part of the slot. Then, the receiving side performs synchronous detection based on the reference phase which is interpolated. This method of obtaining the reference phase adaptively is often called synchronous detection using interpolation pilot signal. There are various methods similar to this method, in which, it is generally performed that interpolation coefficients are decided according to time from each pilot signal.

It is performed to transmit burst data for performing variable rate data transmission. In terms of this case, a technique has been developed in which data signals in one slot are placed to be adjacent to the pilot signal (TECHNICAL REPORT OF IEICE, RCS95-166).

With respect to this point, a concrete description will be given with reference to FIG. 3. FIG. 3 is a figure which shows relationships between the pilot signal and the data signals according to a conventional technique. In this example, the interval of one slot is 1 msec. In addition, when the transmission rate of the data signals is 32 kbps, 32 bit data signals are placed between the pilot signals PS in which continuous transmission is performed. On the other hand, when the data transmission rate is lower than 32 kbps, burst transmission is performed. For example, when the transmission rate is 16 kbps, as shown in the figure, 16 bits of data signals are placed adjacent to the pilot signal PS in the head part of the slot.

However, in the data multiplexer 30 according to the conventional technique, each of the transmission line interleaver 36, 38 needs to perform different bit interleaving for input data of different block sizes and different interleaving spans. Therefore, there is a problem in that the process is not performed effectively.

In the data transmit/receive method using the above-mentioned interpolation pilot signal, when S/N of the transmission line is low so that transmission quality is bad, high level noise is superimposed in received pilot signals. Thus, large error is included in a phase measuring result by using the pilot signal PS. As mentioned above, the reference phase in a slot interval is adaptively estimated in which interpolation coefficients are decided according to times from the pilot signals PS of the head part and the end part. Therefore, near the pilot signal PS, noise is not uniformed so that estimation error becomes large. Thus, there is a problem in that, when data signals are placed adjacent to the pilot signal PS of the head part, a large influence is exerted on the phase so that the transmission quality is deteriorated.

On the other hand, when noise is enough small or the fading pitch is high, influence of phase change due to fading is larger than that due to noise. In this case, transmission quality can be improved by placing data signals near the pilot signal PS.

Solutions for the above-mentioned problems of the data transmit/receive method are proposed in Japanese patent application No. 8-111644. However, an interleaving method applicable for flattening data quality in a flame when data bits are interleaved is not disclosed.

DISCLOSURE OF THE INVENTION

The present invention is contrived in the light of the above-mentioned matters. It is a first object of the present invention to provide an effective data multiplexing method and a data multiplexer wherein multiplexing bits are distributed by performing an interleaving process properly and an error correction ability is exerted at the maximum so that data transmission quality is improved.

It is a second object of the present invention to provide a data transmitting method and a data transmitter in which interleaving process applicable to a data transmit/receive method using the interpolation pilot signal is performed and data quality in a frame is flattened by placing data signals properly in a slot so that transmission quality is improved.

Further, a third object of the present invention is to provide a data transmitting method and a data transmitter which have both effects of distributing multiplexing bits and flattening data quality in a frame in which the data multiplexing method and the data multiplexer of the first object are combined with the data transmitting method and the data transmitter of the second object.

A common object of the present invention is to improve data transmission quality.

In order to achieved the above object, there is provided a method of multiplexing channels, comprising:

a coding step of coding input data for each input channel;

a step of multiplexing the data which is coded;

a step of performing an interleaving process on the data which is multiplexed; and a step of outputting the data on which the interleaving process is performed to a physical channel.

According to the invention, a complex multiplexing part having a sub-block part can be simplified. In addition, since an interleaver is used for each channel commonly, hardware size can be decreased.

In one embodiment, the interleaving process includes the steps of:

writing data into an interleaver;

randomizing columns of the interleaver; and reading data from the interleaver.

According to the invention, since multiplexed bits are distributed in a whole frame, error correction ability can be improved.

In one embodiment, the number of columns of the interleaver is an integral multiple of the number of slots of an output data frame.

In another embodiment, the number of columns of the interleaver is 16 or 32.

In another embodiment, the number of columns of the interleaver is 15 or 30.

According to the invention, since the pilot symbols and the data bits can be placed continuously, apparatuses can be simplified comparing with other methods.

In another embodiment, a pattern used for the randomizing is an interleave pattern suitable for a transmission line interleaver.

According to the invention, interleaving that best suits data transmission can be performed.

In one embodiment, the method further includes, after the coding step:

a step of performing another interleaving process; and a step of segmenting data on which the another interleaving process is performed.

According to the invention, when a block size of input data exceeds a frame length, since inter-frame interleaving is performed beforehand, the block size of the interleaver in the interleaving process described in one embodiment can be the same as the frame size.

The present invention also provides a data multiplexer for multiplexing channels, comprising:

coding means for coding input data for each input channel;

multiplexing means for multiplexing the data which is coded;

an interleaver for performing an interleaving process on the data which is multiplexed; and output means for outputting the data on which the interleaving process is performed to a physical channel.

In another embodiment, the interleaving process includes the steps of:

writing data into the interleaver;

randomizing columns of the interleaver; and reading data from the interleaver.

In one embodiment, the number of columns of the interleaver is an integral multiple of the number of slots of an output data frame.

In another embodiment, the number of columns of the interleaver is 16 or 32.

In a third embodiment, the number of columns of the interleaver is 15 or 30.

In one embodiment, a pattern used for the randomizing is an interleave pattern suitable for a transmission line interleaver.

In another embodiment, the method further includes:

another interleaver for performing another interleaving process after the coding; and segmenting means for segmenting data on which the another interleaving process is performed.

In addition, the present invention provides a data transmitting method which is used in combination with a data signal receive method comprising the steps of regenerating reference phase in each timing of modulated data signal on the basis of each pilot signal which indicates reference phase of modulation and demodulating the data signals, the data transmitting method comprising the steps of: sending the data signals burstly; configuring slots by placing the data signals between pilot signals; and sending the slots, the data transmitting method further comprising:

an interleaving step of performing an interleaving process on the data signals;

a step of dividing data signals to be sent in a slot interval into a plurality of data blocks; and a step of distributing the data blocks in the slot, the interleaving step including a step of performing the interleaving process by using an interleaver in which the number of columns of the interleaver is twice as many as the number of slots in a frame of the data signals.

According to the invention, error rate of data transmission can be decreased and bit quality in a frame can be flattened.

The present invention also provides a data transmitting method which is used in combination with a data signal receive method comprising the steps of regenerating reference phase in each timing of modulated data signals on the basis of each pilot signal which indicates reference phase of modulation and demodulating the data signals, the data transmitting method comprising the steps of: sending the data signals burstly; configuring slots by placing the data signals between pilot signals; and sending the slots, the data transmitting method further comprising:

a coding step of coding data signals for each channel;

a step of multiplexing data signals for each channel;

an interleaving step of performing an interleaving process on the data signals which are multiplexed;

a step of dividing data signals to be sent in a slot interval into a plurality of data blocks; and a step of distributing the data blocks in the slot, the interleaving step comprising:

a step of writing data into an interleaver in which the number of columns of the interleaver is twice as many as the number of slots in a frame of the data signals;

a step of randomizing columns of the interleaver; and a step of reading data from the interleaver.

According to the invention, the effect of flattening bit quality can be obtained while keeping the effect of distributing bits obtained by the data multiplexing method.

In one embodiment, the number of slots in a frame is 15 or 16. According to the invention, only by performing randomization of columns, the effect of distributing bits obtained by the data multiplexing method and the effect of flattening bit quality can be obtained.

In the invention described in claim 18, the method further includes the step of permuting columns of the interleaver partially after the randomizing.

According to the invention, the effect of distributing bits and the effect of flattening bit quality can be obtained in various slot numbers.

In another embodiment, the step of randomizing columns is performed by using an interleaving pattern, which is suitable for transmission line interleaving, for performing randomization of columns and for performing partial permutations of columns. By using such interleaving pattern, the effect of distributing bits and the effect of flattening bit quality can be obtained.

The present invention also provides a data transmitter which is used in combination with a data signal receive apparatus which regenerates reference phase in each timing of modulated data signals on the basis of each pilot signal which indicates reference phase of modulation and demodulates the data signals, wherein the data transmitter sends the data signals burstly; configures slots by placing the data signals between pilot signals; and sends the slots, the data transmitter comprising:

interleaving means for performing an interleaving process on the data signals;

means for dividing data signals to be sent in a slot interval into a plurality of data blocks; and means for distributing the data blocks in the slot, the interleaving means including an interleaver in which the number of columns of the interleaver is twice as many as the number of slots in a frame of the data signals.

Also according to the invention, error rate of data transmission can be decreased and bit quality in a frame can be flattened.

The present invention also provides a data transmitter which is used in combination with a data signal receive apparatus which regenerates reference phase in each timing of modulated data signals on the basis of each pilot signal which indicates reference phase of modulation and demodulates the data signals, wherein the data transmitter sends the data signals burstly; configures slots by placing the data signals between pilot signals; and sends the slots, the data transmitter comprising:

coding means for coding data signals for each channel;

means for multiplexing data signals for each channel;

interleaving means for performing an interleaving process on the data signals which are multiplexed;

means for dividing data signals to be sent in a slot interval into a plurality of data blocks; and means for distributing the data blocks in the slot, wherein the interleaving means:

writes data into an interleaver in which the number of columns of the interleaver is twice as many as the number of slots in a frame of the data signals;

randomizes columns of the interleaver; and reads data from the interleaver.

In one embodiment, the number of slots in a frame is 15 or 16.

In the invention described in claim 23, columns of the interleaver are permuted partially after the columns are randomized.

In the invention described in claim 24, when the columns are randomized, an interleaving pattern, which is suitable for transmission line interleaving, for performing randomization of columns and for performing partial permutations of columns is used.

BRIEF DESCRIPTION OF THE DRAWINGS

FIG. 6 shows an randomizing pattern of a first interleaver;

FIG. 11 shows column randomization patterns, suitable for a transmission line interleaver;

FIG. 28 is a figure for explaining a method of performing partial permutation of columns when 1 frame=15 slots.

PREFERRED EMBODIMENTS FOR CARRYING OUT THE INVENTION

Figure 1:
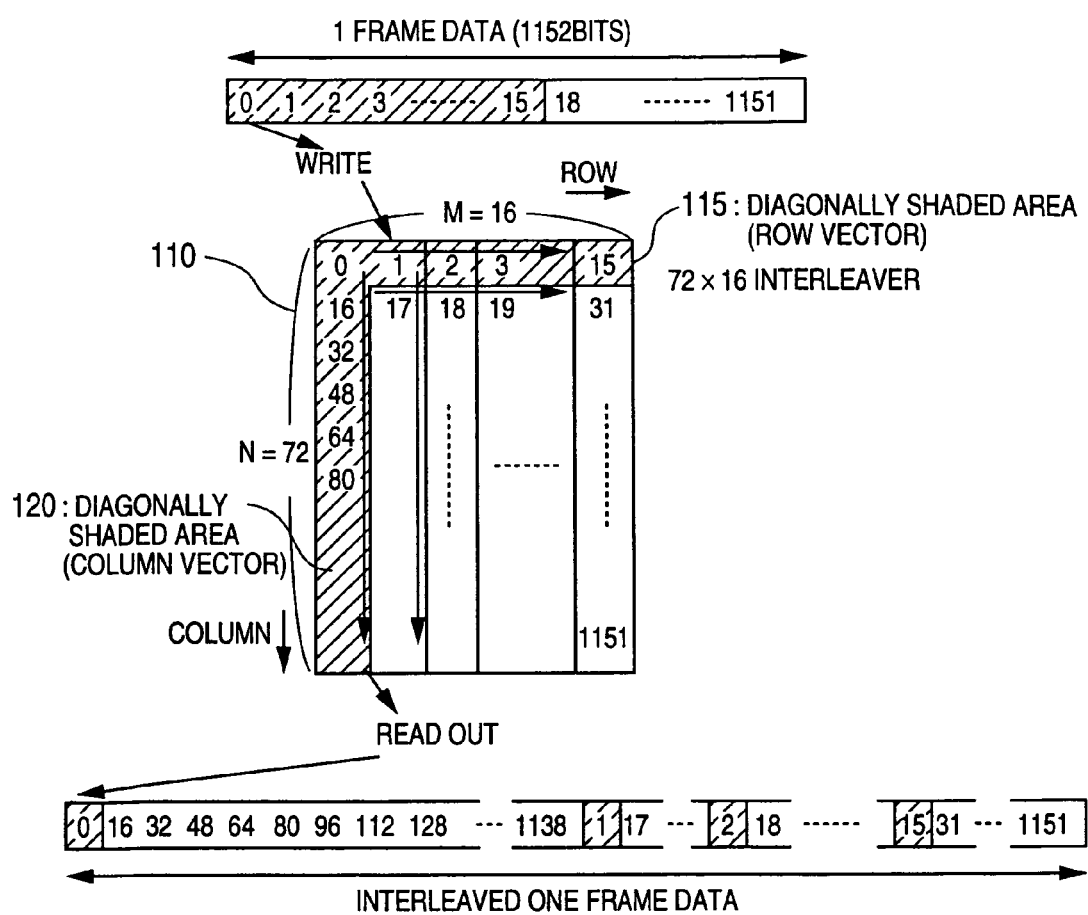
FIG. 1 shows an example of an interleaving method according to a conventional technique.
Figure 2:
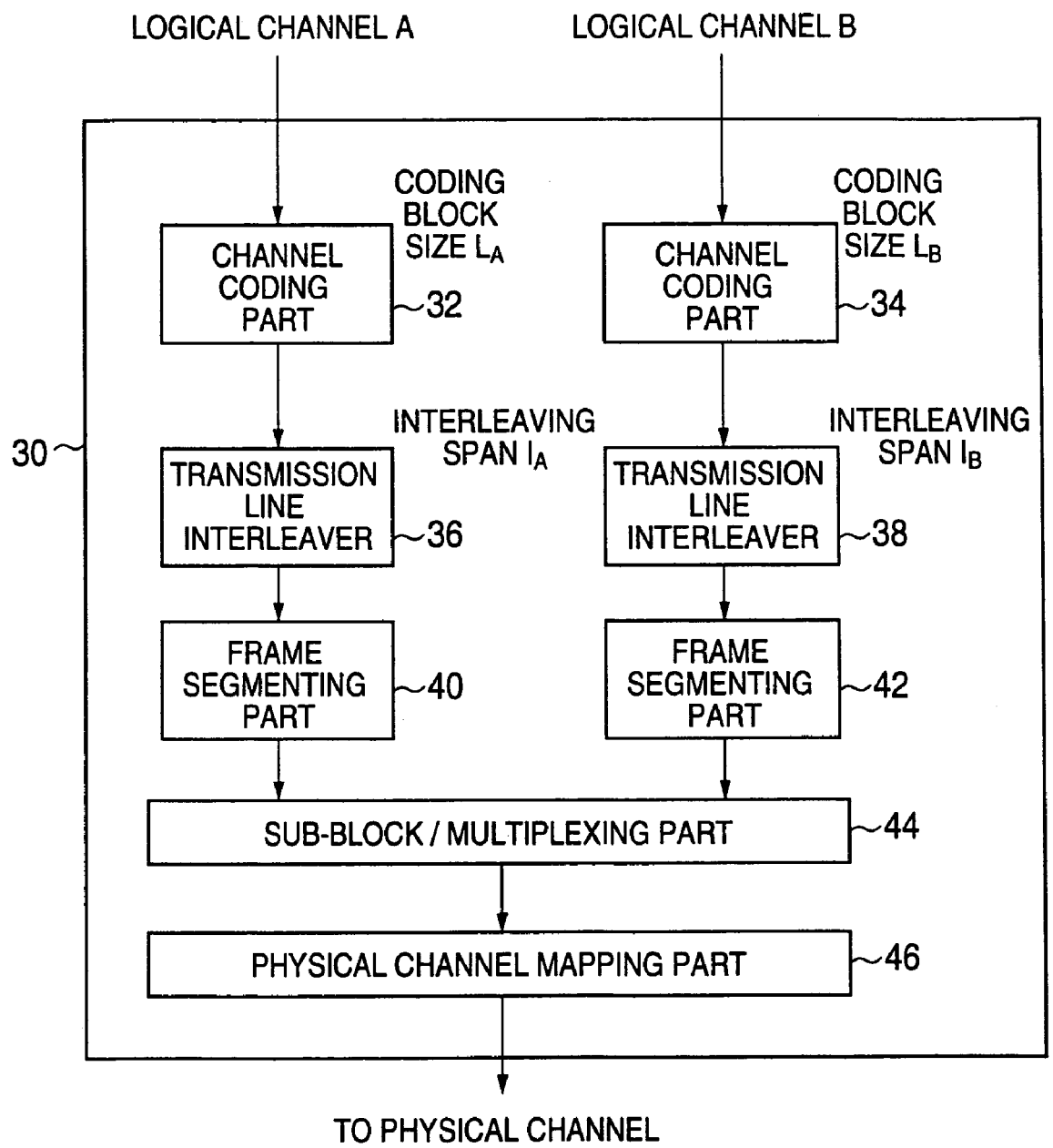
FIG. 2 is a block diagram of a data multiplexer according to a conventional technique.
Figure 3:
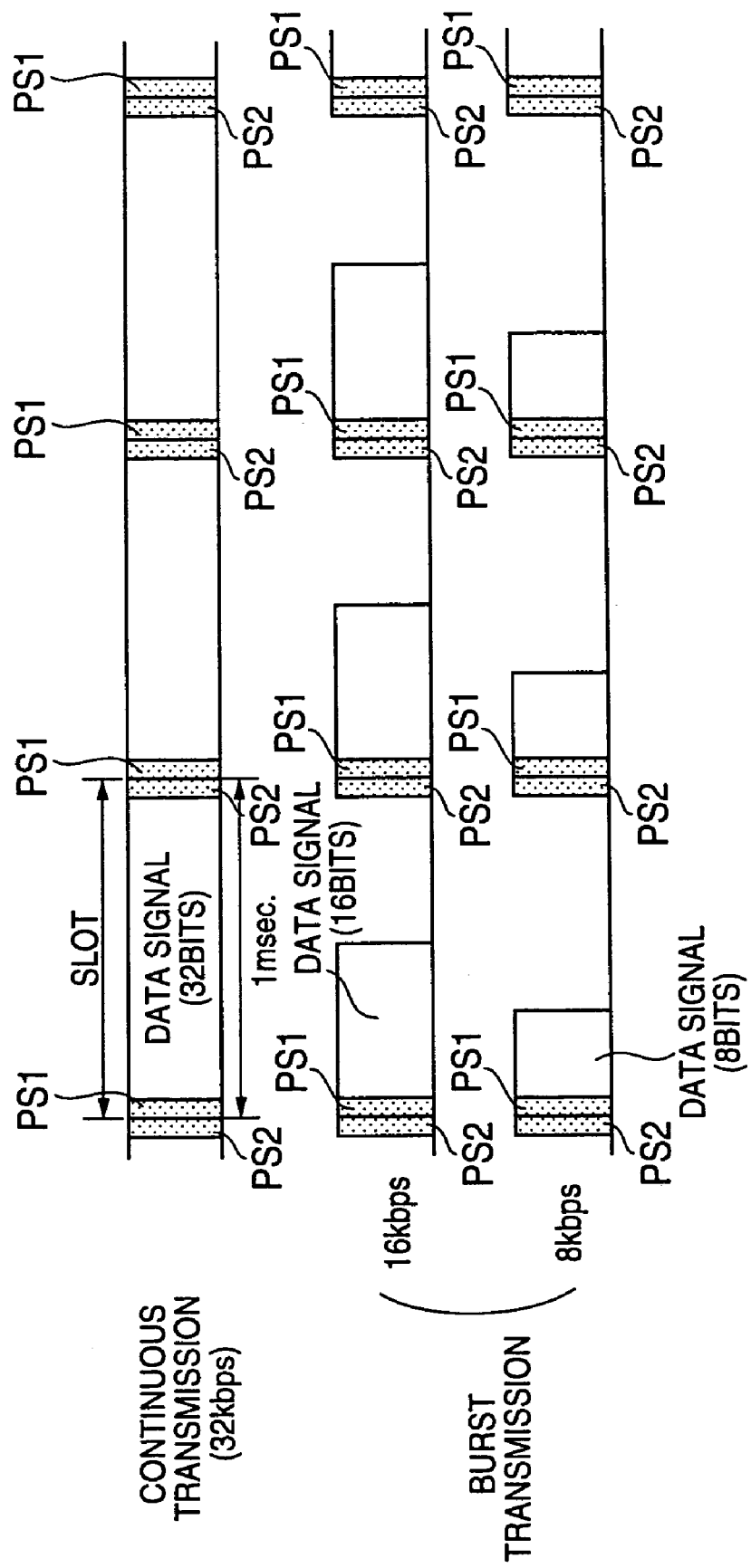
FIG. 3 is a figure which shows a slot configuration relating to a data signal transmission according to a conventional technique.
Figure 4:
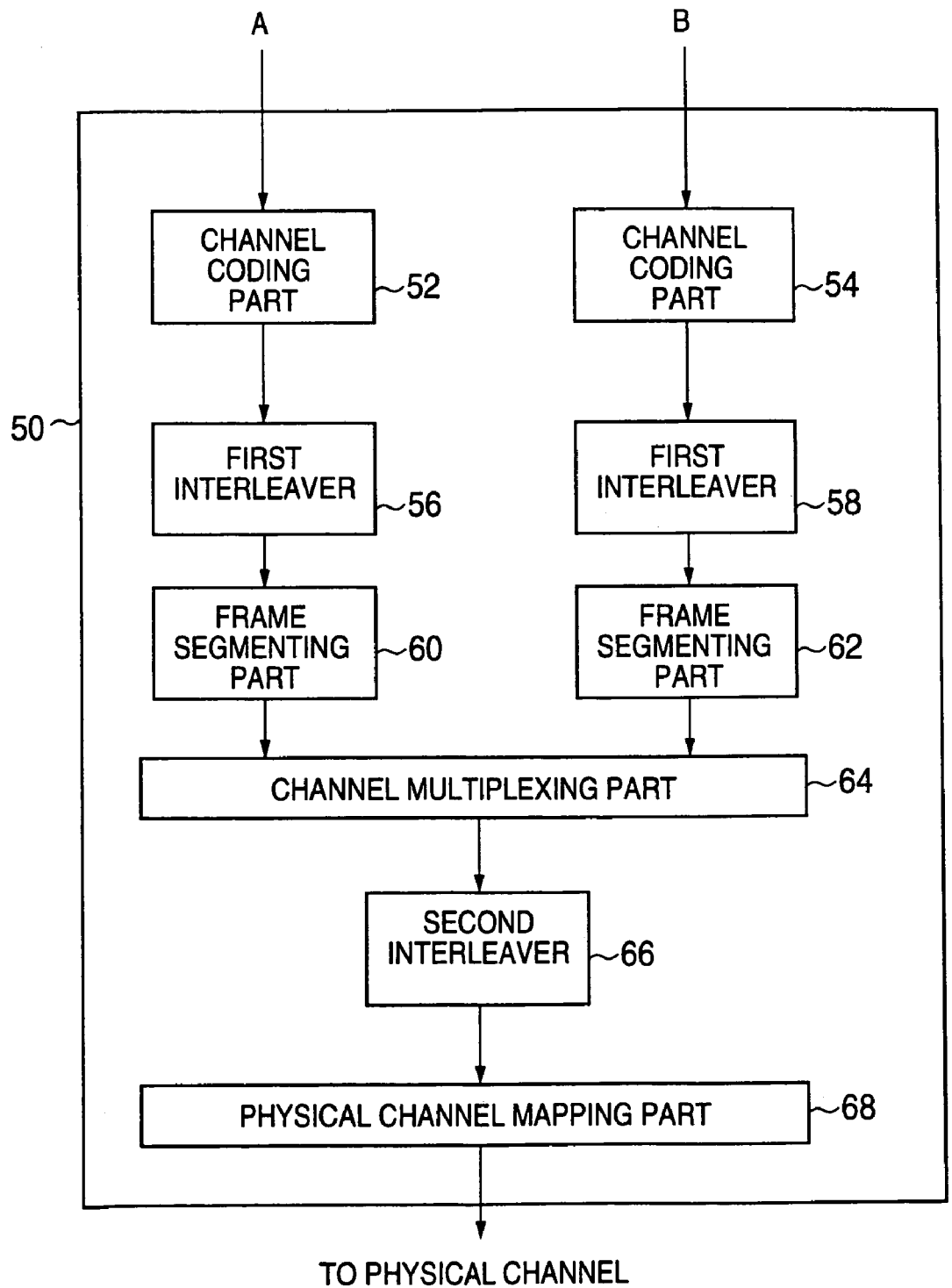
FIG. 4 is a block diagram of a data multiplexer according to an embodiment of the present invention.

FIG. 4 is a block diagram of a data multiplexer 50 according to an embodiment of the present invention which corresponds to the first object. The data multiplexer 50 includes channel coding parts 52, 54, first interleavers 56, 58, frame segmenting parts 60, 62, a channel multiplexing part 64, a second interleaver 66 and a physical channel mapping part 68.

In the figure, the channel coding part 52, the first interleaver 56 and the frame segmenting part 60 perform an interleaving process of the logical channel A. The channel coding part 54, the first interleaver 58 and the frame segmenting part 62 perform an interleaving process of the logical channel B. Next, the operation of the data multiplexer 50 will be described by using a data flow which is input from the logical channel A. The following description also apply to a data flow input from the logical channel B.

The channel coding part 52 performs a channel coding process on data input by the logical channel A. Then, the interleaving process is performed in the first interleaver 56 when the block size of the data exceeds one frame. The process in the first interleaver will be called an inter-frame interleaving process. Next, frame segmenting for multiplexing is performed in the frame segmenting part 60. Then, in the channel multiplexing part 64, the data of the logical channel A is multiplexed with data of the logical channel B on which the same processes has been performed.

An interleaving process is performed, in the second interleaver 66, on the data which is multiplexed in this way.

Here, since the inter-frame interleaving process is performed in the first interleavers 56, 58, the block size of an interleaver in the second interleaver 66 can be the same as that of the frame size of the data. The interleaving process in the second interleaver will be called an intra-frame interleaving process. Next, the data is mapped to the physical channel by the physical channel mapping part 68 so that data is output to the physical channel.

Figure 5:
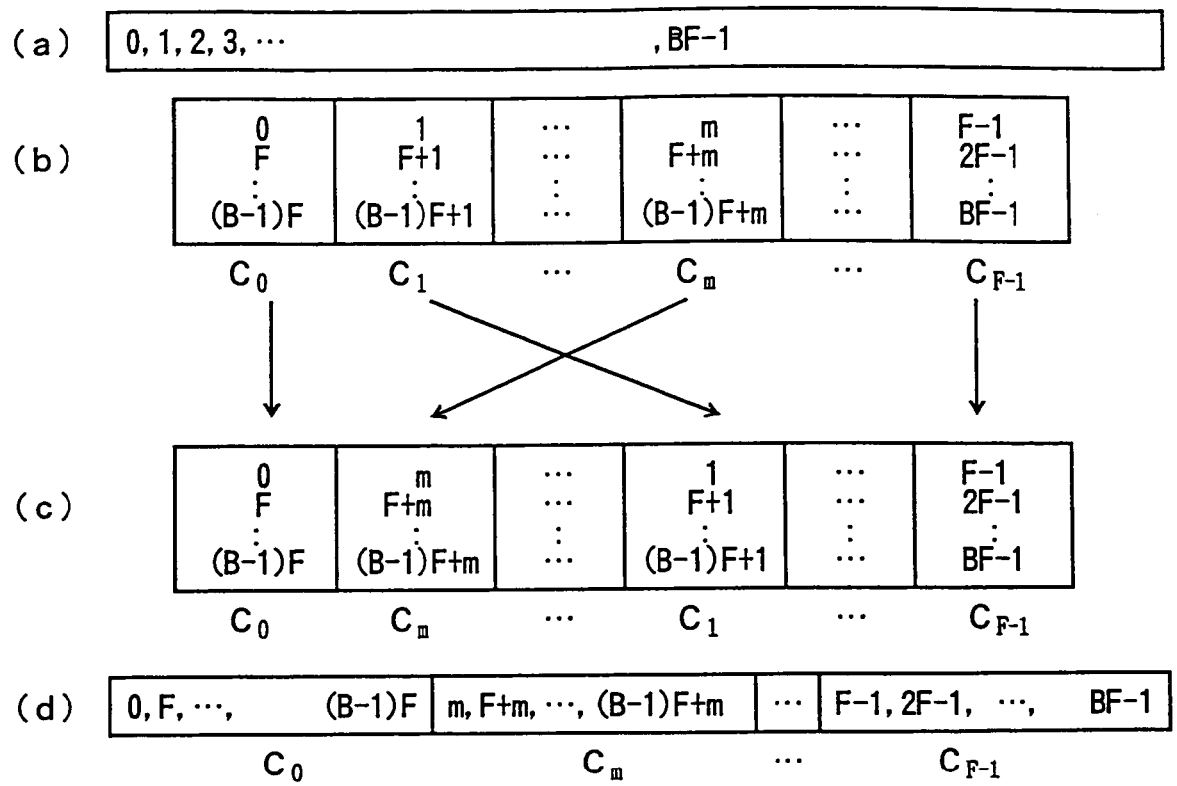
FIG. 5 shows an interleaving method of the data multiplexer of the present invention.

The above-mentioned inter-frame interleaving process in the first interleaver is performed, for example, by using an interleaving method shown in FIG. 5. In the figure, F indicates the number of columns of the interleaver, B indicates the number of rows, $C_m$ indicates data of mth column. As shown in the figure, input data indicated by (a) is written into a B×F matrix as shown in (b). Then, as shown in (c), the columns are randomized. After that, data which is interleaved is obtained as shown in (d) by reading out data column by column from the matrix shown in (c).

The method shown in FIG. 5 is different from the conventional example in that columns are randomized. Accordingly, performance of interleaving can be improved. In addition, additional randomizing can be performed. Such an interleaving method in which randomizing is performed is called a multi-stage interleaving method. A detail description of the multi-stage interleaving method is disclosed in TECHNICAL REPORT of IEICE, A•P97-178, RCS97-216, NW97-161(1998–02), pp. 23–30 (SHIBUTANI, SUDA, ADACHI).

FIG. 6 shows an example of the randomizing according to the embodiment of the present invention. As shown in the figure, when the interleaving span is 10 ms, since the frame length and the interleaving span become the same, the number of columns becomes 1 and the randomizing pattern becomes $C_0$. That is, data input to the first interleaver is output as-is. For data in which the interleaving span is equal to or longer than 20 ms, the randomizing patterns shown in the figure are used. For example, when the interleaving span is 80 ms, the columns are permutated in an order of $C_0$, $C_4$, $C_2$, $C_6$, $C_1$, $C_5$, $C_3$, $C_7$. The patterns shown in FIG. 6 is suitable for data transmission. However, other randomizing patterns can be used.

Next, the intra-frame interleaving process in the second interleaver will be described.

Figure 7:
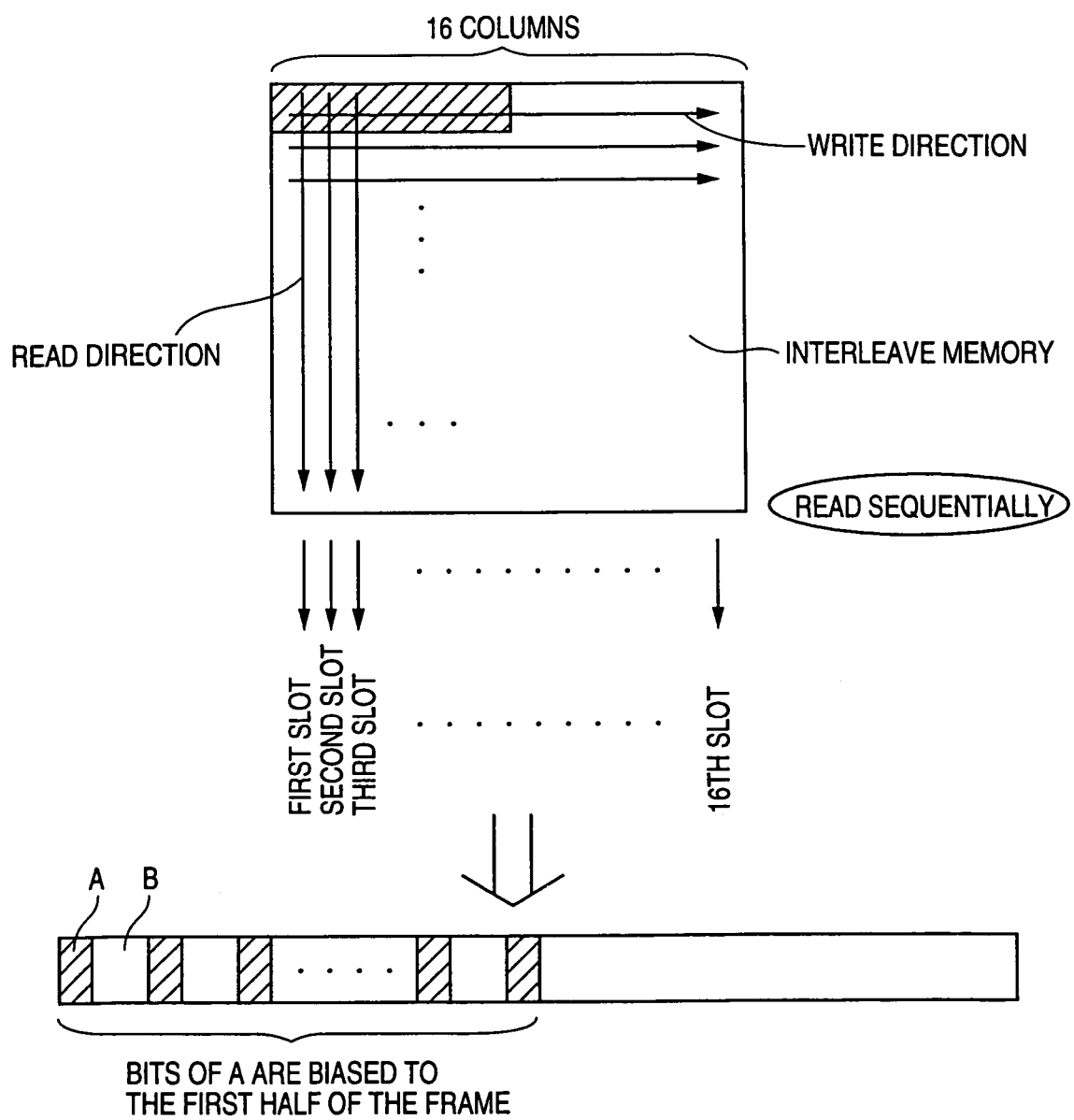
FIG. 7 is a figure for explaining an interleaving method of a second interleaver (conventional method)

As the intra-frame interleaving process, it is possible to use the interleaving method described in the background art. However, for example, when the number of bits of the logical channel A is smaller than that of the logical channel B, a phenomenon shown in FIG. 7 occurs. (FIG. 7 shows a case in which the number of columns 16 of the interleaver is the same as the number of slots in the frame.)

That is, when multiplexed data is written in an interleave memory, data amount of the logical channel A in a frame is small, writing of the data of the logical channel A into the interleave memory ends halfway through the first row. After that, data of the logical channel B is written in the interleave memory. Therefore, as for the output data from the interleave memory, data bits of the logical channel A are biased to the first half of the output frame so that error correction capability of channel coding can not be exerted at the maximum.

Figure 8:
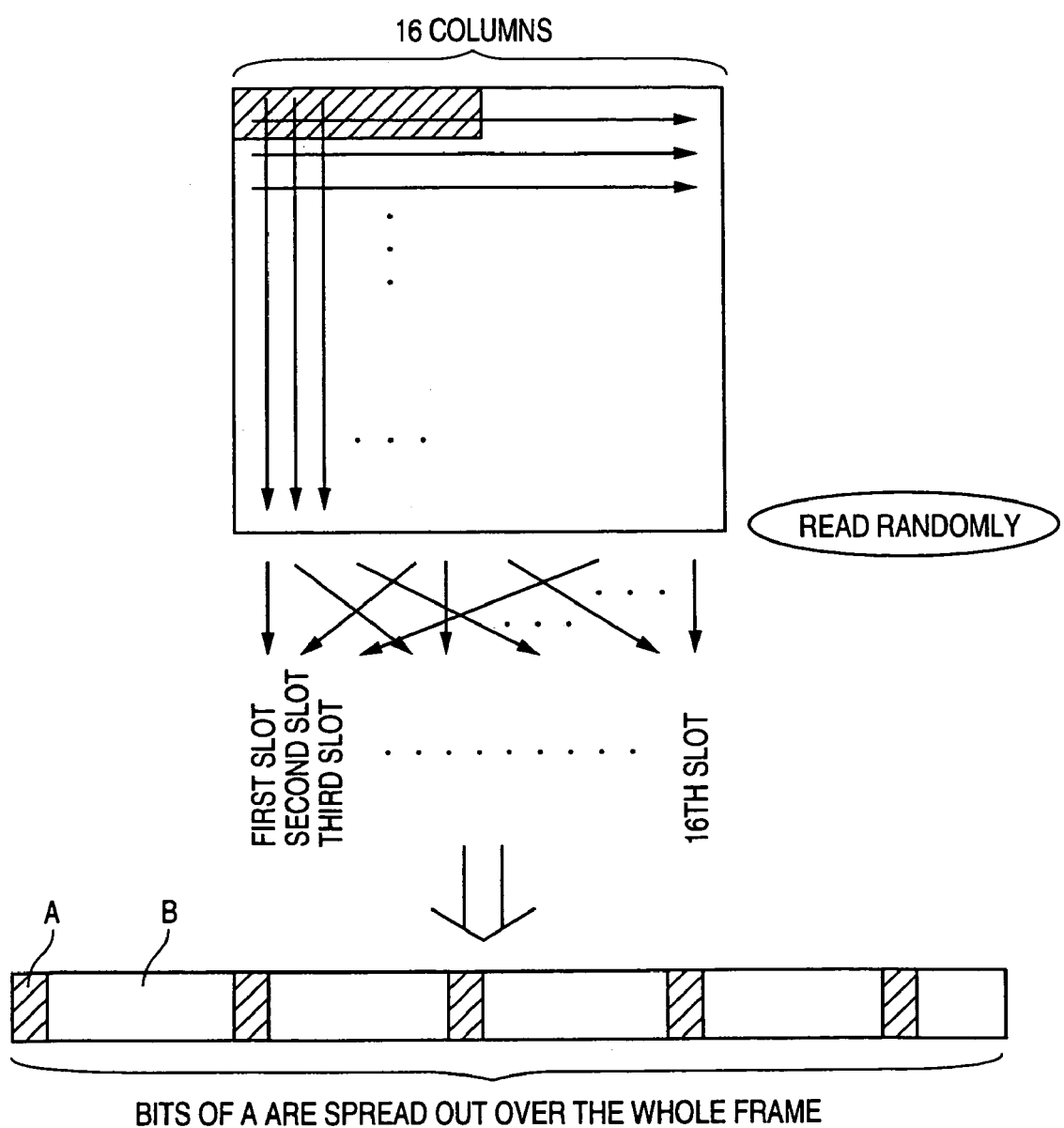
FIG. 8 is a figure for explaining an interleaving method of the second interleaver according to the present invention.
Figure 9:
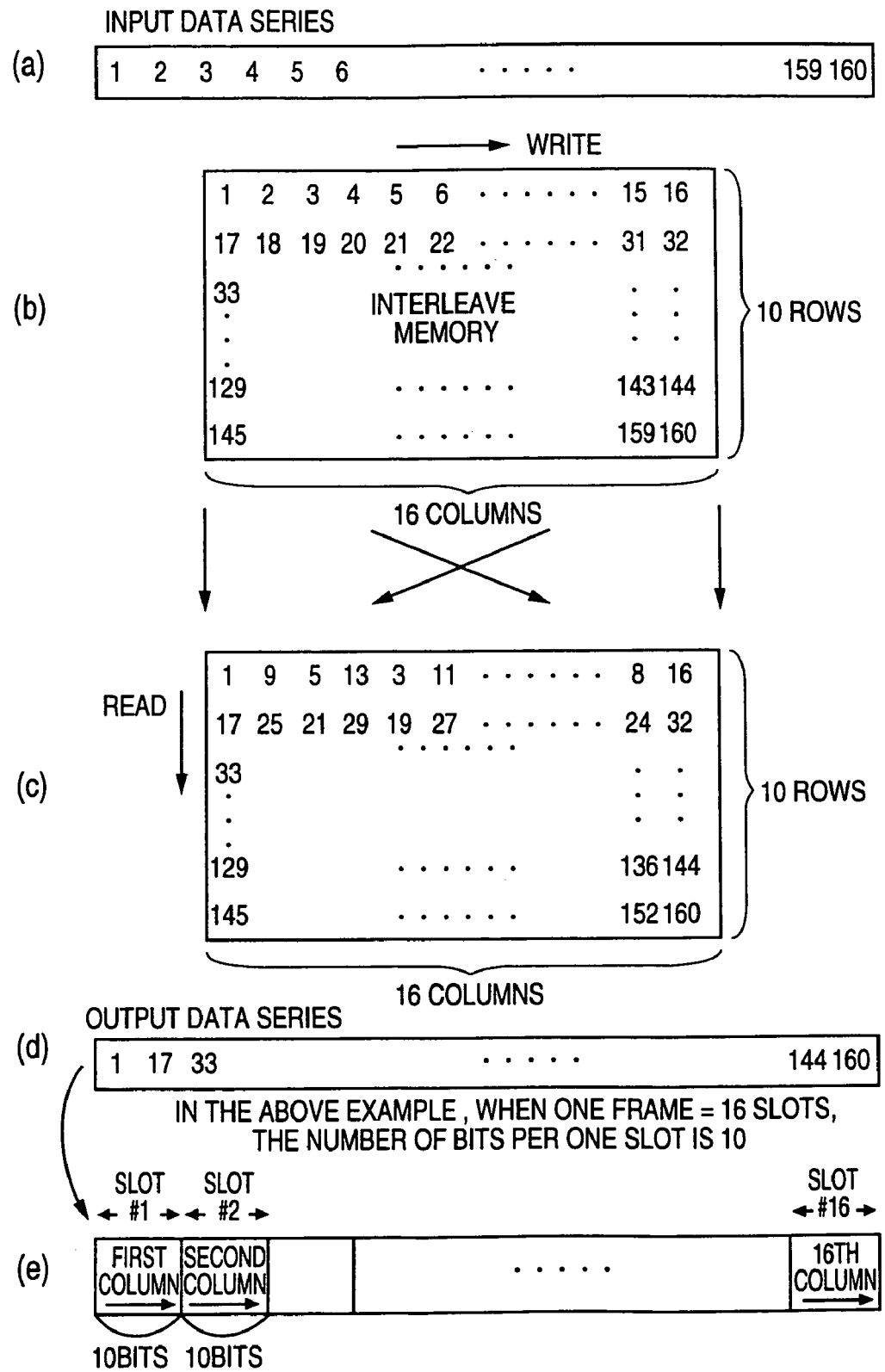
FIG. 9 shows an example of an interleaving process in the second interleaver.
Figure 10:
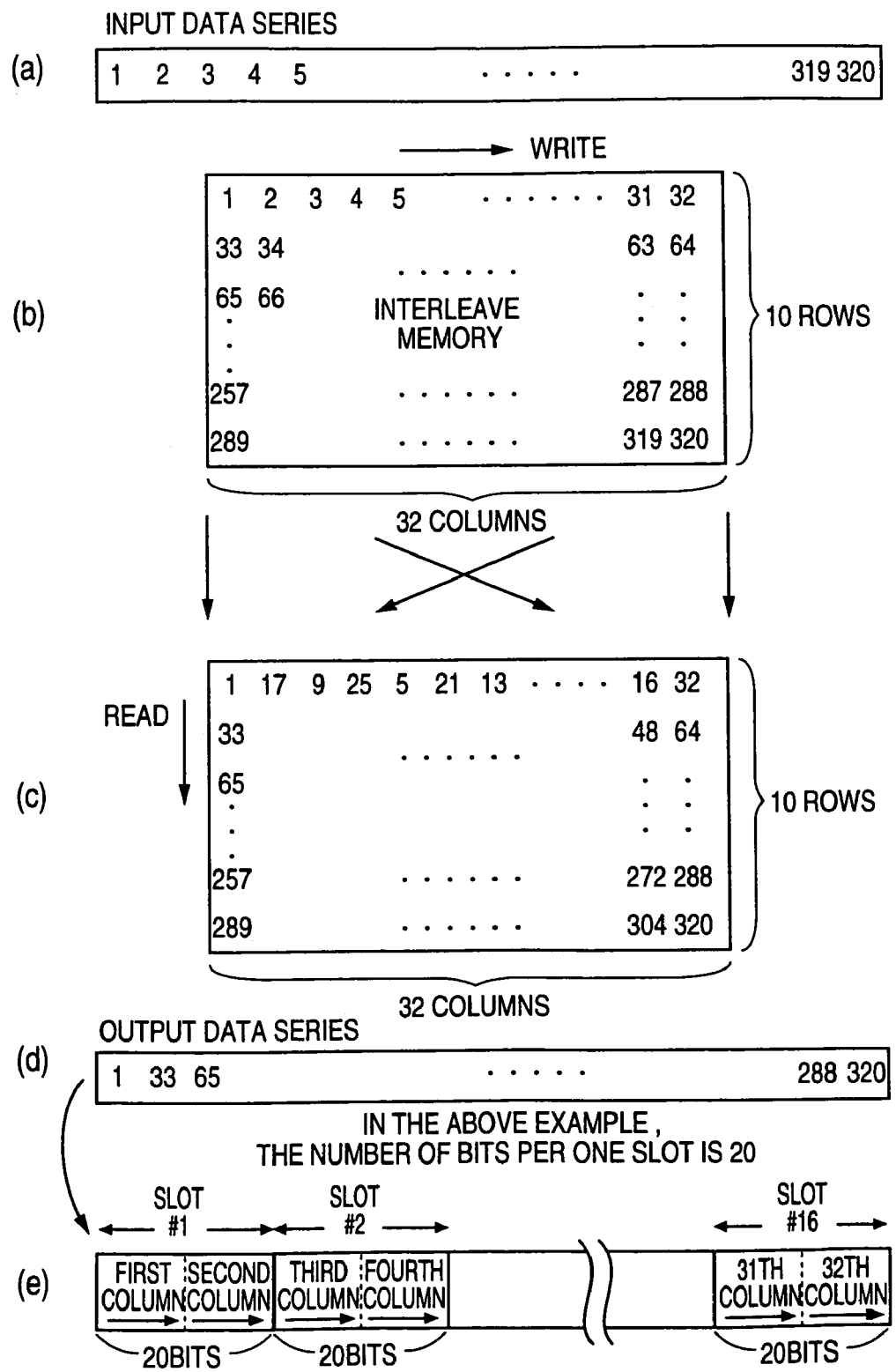
FIG. 10 shows an example of an interleaving process in the second interleaver.

Thus, in the embodiment of the present invention, the intra-frame interleaving process is performed by using the interleaving method shown in FIG. 5. That is, as shown in FIG. 8, data is output after randomizing columns. Accordingly, bits of the logical channel A are spread out over the frame so that the above phenomena does not occur. FIG. 8 shows a case when the number of columns is 16. More particularly, processes shown in FIG. 9 are performed. As shown in the figure, an input data series shown in (a) is written into an interleaver shown in (b) having 16 columns. Then, randomizing columns are performed as shown in (c) according to a pattern ($C_0$, $C_8$, $C_4$, $C_{12}$, $C_2$, $C_{10}$, $C_6$, $C_{14}$, $C_1$, $C_9$, $C_5$, $C_{13}$, $C_3$, $C_{11}$, $C_7$, $C_{15}$) which is suitable for data transmission. After that, data shown in (d) is output. In this example, when assuming 1 frame=16 slots, the number of bits per a slot becomes 10 as shown in (e). Further, FIG. 10 shows an example of an interleaver having 32 columns. In this case, the number of bits per a slot is 20.

As the pattern used for randomizing columns, a pattern ($C_0$, $C_{16}$, $C_8$, $C_{24}$, $C_4$, $C_{20}$, $C_{12}$, $C_{28}$, $C_2$, $C_{18}$, $C_{10}$, $C_{26}$, $C_6$, $C_{22}$, $C_{14}$, $C_{30}$, $C_1$, $C_{17}$, $C_9$, $C_{25}$, $C_5$, $C_{21}$, $C_{13}$, $C_{29}$, $C_3$, $C_{19}$, $C_{11}$, $C_{27}$, $C_7$, $C_{23}$, $C_{15}$, $C_{31}$) suitable for data transmission can be used. This pattern is for a case in which the number of columns is 32 (=16×2). FIG. 11 shows patterns, for each number of columns, suitable for transmission line interleaver. Every pattern described so far is shown in this figure.

It is effective to set the number of columns as 16 or 16×K (an integer) in a case when 1 frame includes 16 slots. The reason of this will be described with reference to FIGS. 12 and 13. Here, a case is considered in which data amount to be sent is half of data bits which can be sent at the maximum and the data is sent by the first half of the frame.

Figure 12:
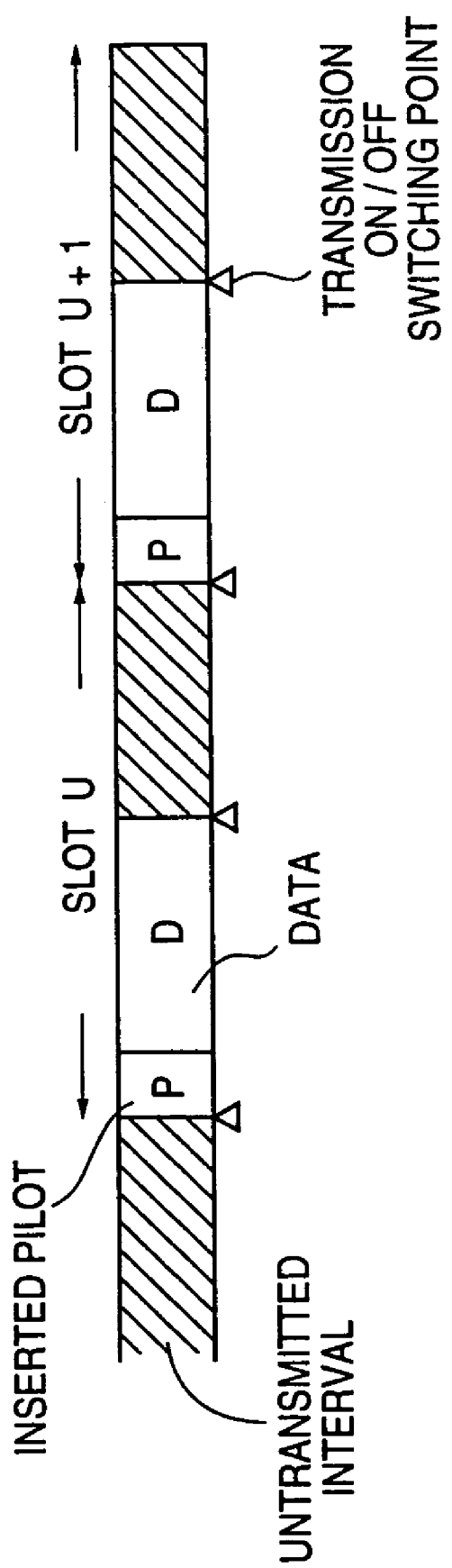
FIG. 12 is a figure for explaining effects caused by setting the number of columns of the second interleaver as multiples of 16.

FIG. 12 shows output data when the number of columns=16×K (an integer). In this figure, Δ indicates a switching point between transmission ON/OFF. As shown in this figure, when the number of columns is 16×K (an integer), an slot interval agrees with a read column of an interleaver so that it becomes possible to place the pilot symbol and the data bits continuously.

Figure 13:
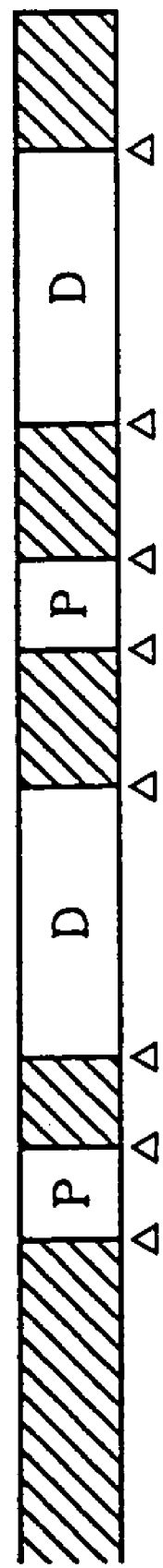
FIG. 13 shows a case when the number of columns of the second interleaver is not set as multiples of 16.

FIG. 13 is a figure showing a case when the number of columns is not 16×K (an integer). In contrast to the case of the number of columns=16×K (an integer), an slot interval does not agree with a read column of an interleaver so that the pilot symbol and the data bits are not placed continuously. Thus, there occurs some parts in which the transmission ON/OFF points appear in shorter interval. Since an transmission amplifier for realizing the transmission ON/OFF of short interval becomes more complex, it is effective for decreasing the complexity of the transmission amplifier to set the number of columns to be 16×K (an integer).

In addition, when one frame includes 15 slots, the above mentioned effect can be obtained by setting the number of columns to be 15×K (an integer).

Figure 14:
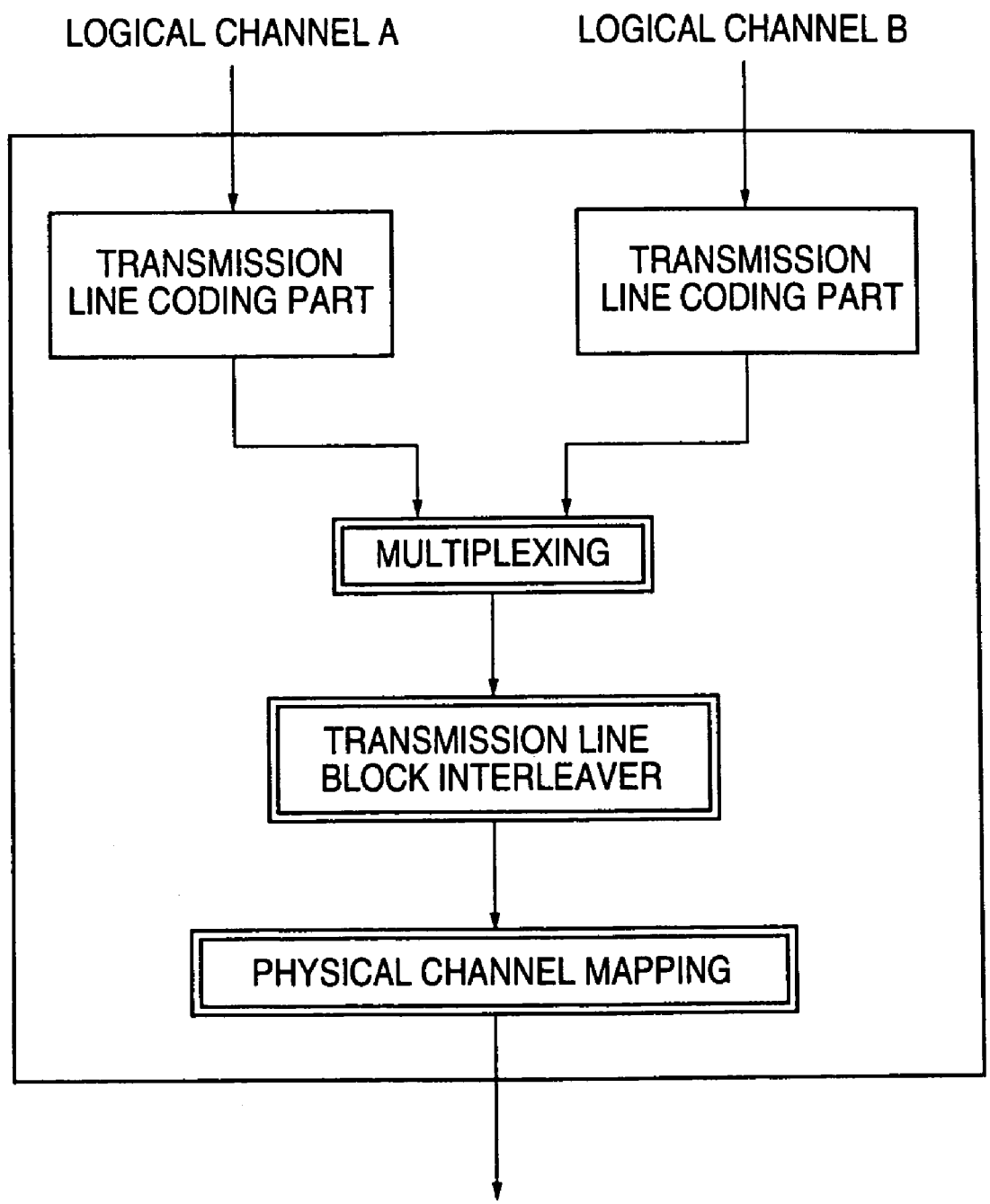
FIG. 14 shows another example of the data multiplexer of the present invention.

When the interleave block sizes of the two channels of the logical channel A and the logical channel B are the same or when each of them do not exceeds one frame, the first interleavers shown in FIG. 4 are not necessary. Therefore, in such a case, the data multiplexer can be configured as shown in FIG. 14. Accordingly, the apparatus can be simplified.

A data demultiplexer which corresponds to the data multiplexer described so far can be realized by using a deinterleaver. The configuration of the data demultiplexer is obvious by a person skilled in the art by referring to this specification.

In the following, an embodiment of the present invention corresponding to the second object will be described. This embodiment is suitable for a case in which quality of data signals needs to be flattened when data is sent burstly.

Figure 15:
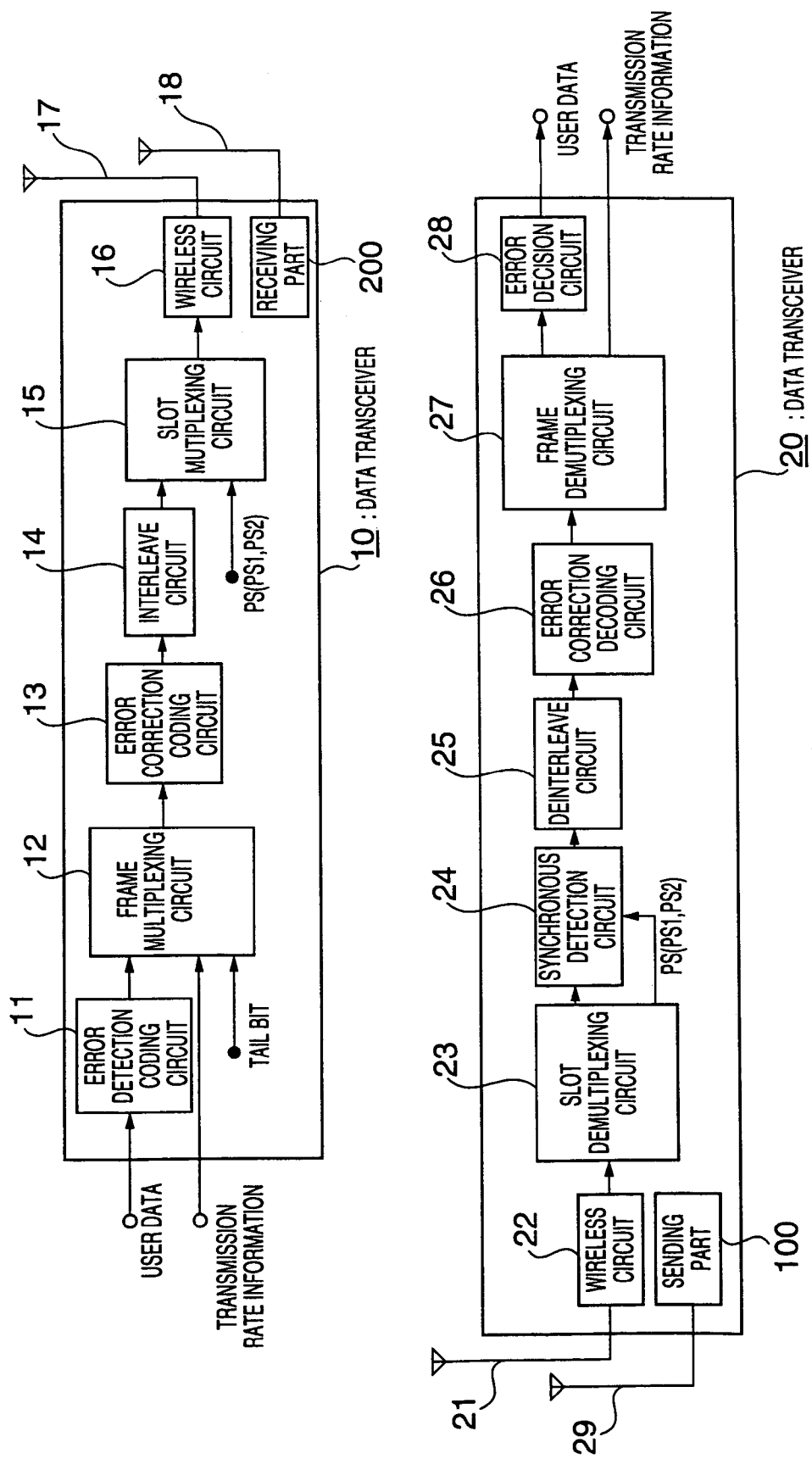
FIG. 15 shows a block diagram of a data transmission system using a data transmitting method relating to the present invention.

In the following, the configuration of the embodiment will be described with reference to FIG. 15. FIG. 15 shows a block diagram of a data transmission system using a data transmitting method relating to the present invention. As shown in FIG. 15, the data transmission system includes a data transmission apparatus 10 in a base station side and includes a data transmission apparatus 20 in the mobile station side. Both of the data transmission apparatus 10 and 20 can send and receive data and can perform two-way simultaneous communication. In this example, the base station transmits data to the mobile station. Thus, in the data transmission apparatus 10 of FIG. 15, parts relating to transmission are mainly shown, and in the data transmission apparatus 20 of FIG. 15, parts relating to receiving are mainly shown. The data transmission apparatus 10 in the base station side includes, as main parts, an error detection coding circuit 11, a frame multiplexing circuit 12, an error correction coding circuit 13, an interleave circuit 14, a slot multiplexing circuit 15, a wireless circuit 16 and an antenna 17. In addition, the data transmission apparatus 10 includes a receiving part 200 and an antenna 18.

The error detection coding circuit 11 generates error detection code based on user data UD and adds the error detection code to the user data. UD. As the error detection code, for example, 16 bit CRC code is used. To be more specific, the user data is divided by a predetermined generating polynomial and the remainder is added to the user data UD. The frame multiplexing circuit 12 receives the user data UD to which the error detection code has been added, transmission rate information which indicates the transmission rate of the user data UD and tail bits for convolutional coding. The frame multiplexing circuit 12 forms a frame from these data according to a predetermined frame format.

The error correction coding circuit 13 is connected to the frame multiplexing circuit 12 and performs convolutional coding for the data signals which are formed as the frame. The interleave circuit 14 performs bit interleaving on the data signals which are convolutional coded. Accordingly, burstly continuous errors can be prevented. A detail description on the process in the interleave circuit 14 will be given later. The slot multiplexing circuit 15 forms slots based on the bit interleaved data signals and the pilot signals. In this case, the pilot signals PS are placed in the head part and in the end part of each slot. In the following description, when the pilot signal of the head part and the pilot signal of the end part are described as distinguished from each other, the pilot signal of the head part will be called a first pilot signal PS1 and the pilot signal of the end part will be called a second pilot signal PS2. The wireless circuit 16 modulates signals from the slot multiplexing circuit 15 and sends the modulated signals via the antenna 17. As a method of the modulation, for example, spread spectrum modulation, QPSK and the like can be used.

Next, the signal which is sent from the data transmission apparatus 10 is received by the data transmission apparatus 20.

The data transmission apparatus 20 includes a wireless circuit 22, a slot demultiplexing circuit 23, a synchronous detection circuit 24, a deinterleave circuit 25, an error correction decoding circuit 26, a frame demultiplexing circuit 27 and an error decision circuit 28. In addition, the data transmission apparatus 20 includes a sending part 100 and an antenna 29.

The wireless circuit 22 amplifies the received signal to a predetermined level. The slot demultiplexing circuit 23 demultiplexes the signal forming each slot into data signals and the pilot signal PS. The synchronous detection circuit 24 obtains the reference phase of an interval from the first pilot signal PS1 to the second pilot signal PS2 by using interpolation on the bases of the first pilot signal PS1 and the second pilot signal PS2. Then, the synchronous detection circuit 24 demodulates signals output from the slot demultiplexing circuit 23 based on the reference phase obtained by interpolation so as to generate data signals.

The relationship between the deinterleave circuit 25 and the interleave circuit 14 is complementary, in which the deinterleave circuit 25 performs deinterleaving on the synchronous detected data signals. The error correction decoding circuit 26 performs Viterbi decoding on the deinterleaved data signals. The frame demultiplexing circuit 27 demultiplexes the output data signals from the error correction decoding circuit 26 into Viterbi decoded data signals and transmission rate information. The error decision circuit 28 divides the Viterbi decoded data signals by the generating polynomial used at the error detection coding circuit 11, and deletes the error detection code so as to output the user data UD. In this case, if the remainder of the division is 0, it is judged that there is no error. On the other hand, if the remainder is not 0, it is judged that there is an error.

The receiving part 200 provided in the data transmission apparatus 10 includes parts from the wireless circuit 22 to the error decision circuit 28. The sending part 100 provided in the data transmission apparatus 20 includes parts from the error detection coding circuit 11 to the wireless circuit 16. In this case, the sending part 100 and the receiving part 200 communicate by using frequencies different from frequencies used by the wireless circuit 16 and the wireless circuit 22. More particularly, signals from the sending part 100 are received by the receiving part 200 via the antenna 29, 18. Accordingly, two-way simultaneous communication can be performed between the data transmission apparatus 10 and the data transmission apparatus 20.

The interleave circuit 14 performs bit interleaving over a plurality of slots.

Figure 16:
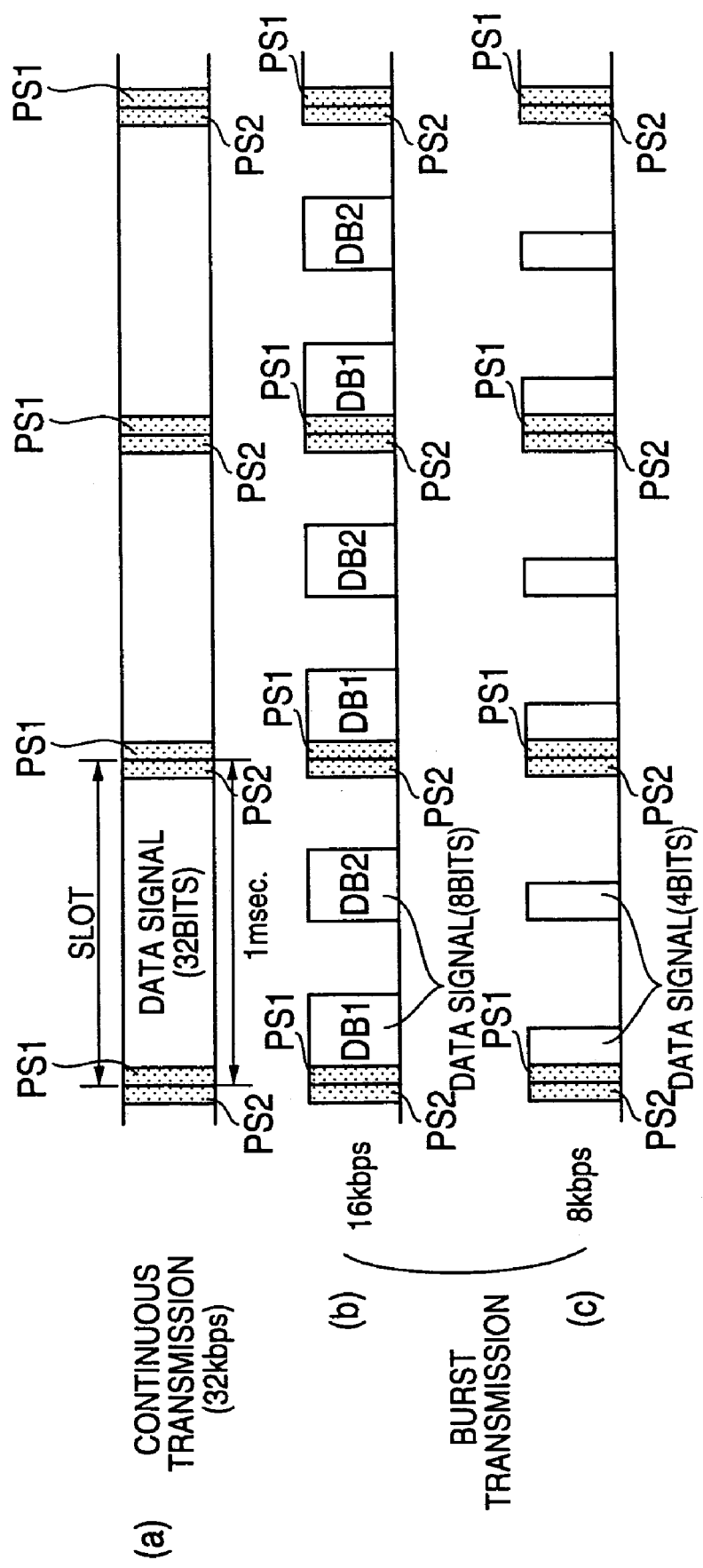
FIG. 16 shows first examples of slot configuration of an embodiment of the present invention.

FIG. 16 shows first examples of slot configurations according to a second embodiment of the present invention. The slot multiplexing circuit 15, as mentioned above, places data signals between the first pilot signal PS1 and the second pilot signals PS2. For example, when assuming that the slot interval is 1 msec and the data transmission rate is 32 kbps, continuous transmission is performed as shown in FIG. 16(a). On the other hand, when the transmission rate is smaller than 32 kbps, transmission is performed burstly such as shown in (b) and (c).

For example, when the transmission rate of data signals is 16 kbps, the number of bits of the data signals per one slot is 16. The slot multiplexing circuit 15 of this example divides the 16 bit data signals into two parts each of which is an 8 bit data block DB. Then, as shown in (b), a first data block DB1 is placed to be adjacent to the first pilot signal PS1. A second data block DB2 is placed such that the start of the second data block DB2 is located at the center of the slot. As shown in (c), also when the data transmission rate is 8 kbps, data blocks of 4 bit unit are generated and the data blocks DB1 and DB2 are placed at predetermined points shown in FIG. 16 in the same way as when the transmission rate is 16 kbps.

In the following, processes in the interleave circuit 14 in the above-mentioned example will be described in detail. It is conceivable to use an interleaver which has the same number of columns as the number of slots per one frame when the interleave circuit 14 performs an interleaving process. However, when doing so, there occurs a following problem which will be described with reference to FIG. 17.

Figure 17:
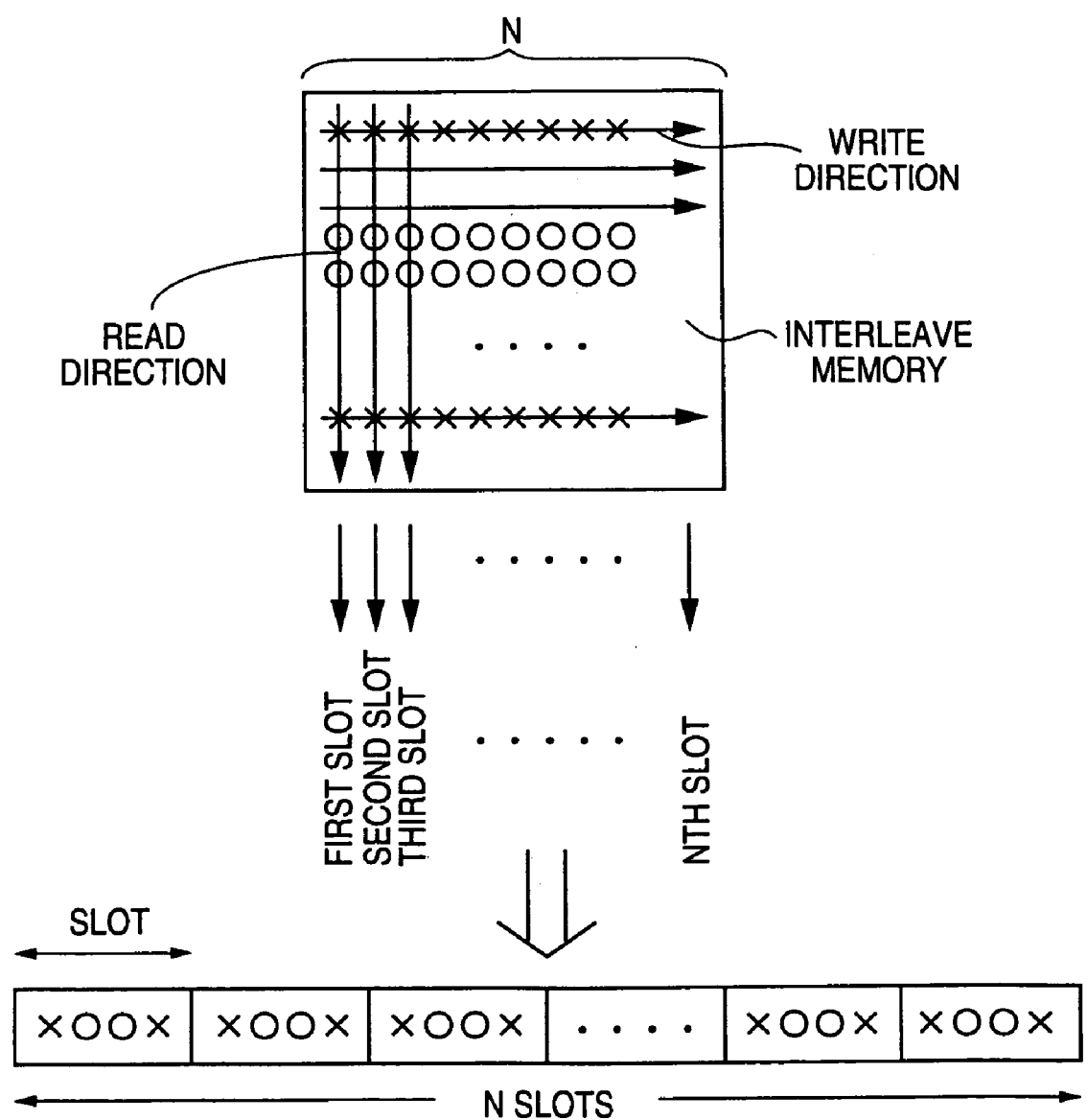
FIG. 17 is a figure for explaining a problem which occurs when the number of slots and the number of columns are the same in the interleaving process in an interleaving circuit 14.

FIG. 17 shows an block interleaver having N columns and the output data, in which each column which is read out in the reading direction corresponds to each of N slots in one frame. That is, the number of columns of the interleaver is the same as that of slots between which slots pilots are inserted.

As mentioned before, quality difference occurs bit by bit in a slot according to transmission quality and the. For example, quality of a bit adjacent to the pilot signal deteriorates as shown × in each slot of the output data shown in FIG. 17. The × in the output data corresponds to × in the interleaver. When such data is deinterleaved, quality distribution in a slot becomes the same as that in the deinterleaved frame even after error correction decoding is performed. That is, bit quality in a part near the head of the frame and a part near the end of the frame is low. In digital transmission of voice, it is generally seen that specific information is conveyed by a specific bit. Therefore, when quality is biased in a frame although average bit error rate in a whole frame is the same, the specific bit receives a detrimental effect so that voice transmission quality deteriorates unexpectedly and there occurs a problem in providing mobile communication services.

In addition, when quality of a part close to the pilot signal is better than that of a center part in a slot, DB2 shown in FIG. 16 receives the above detrimental effect. That is, bit quality in the center part of the frame deteriorates.

Figure 18:
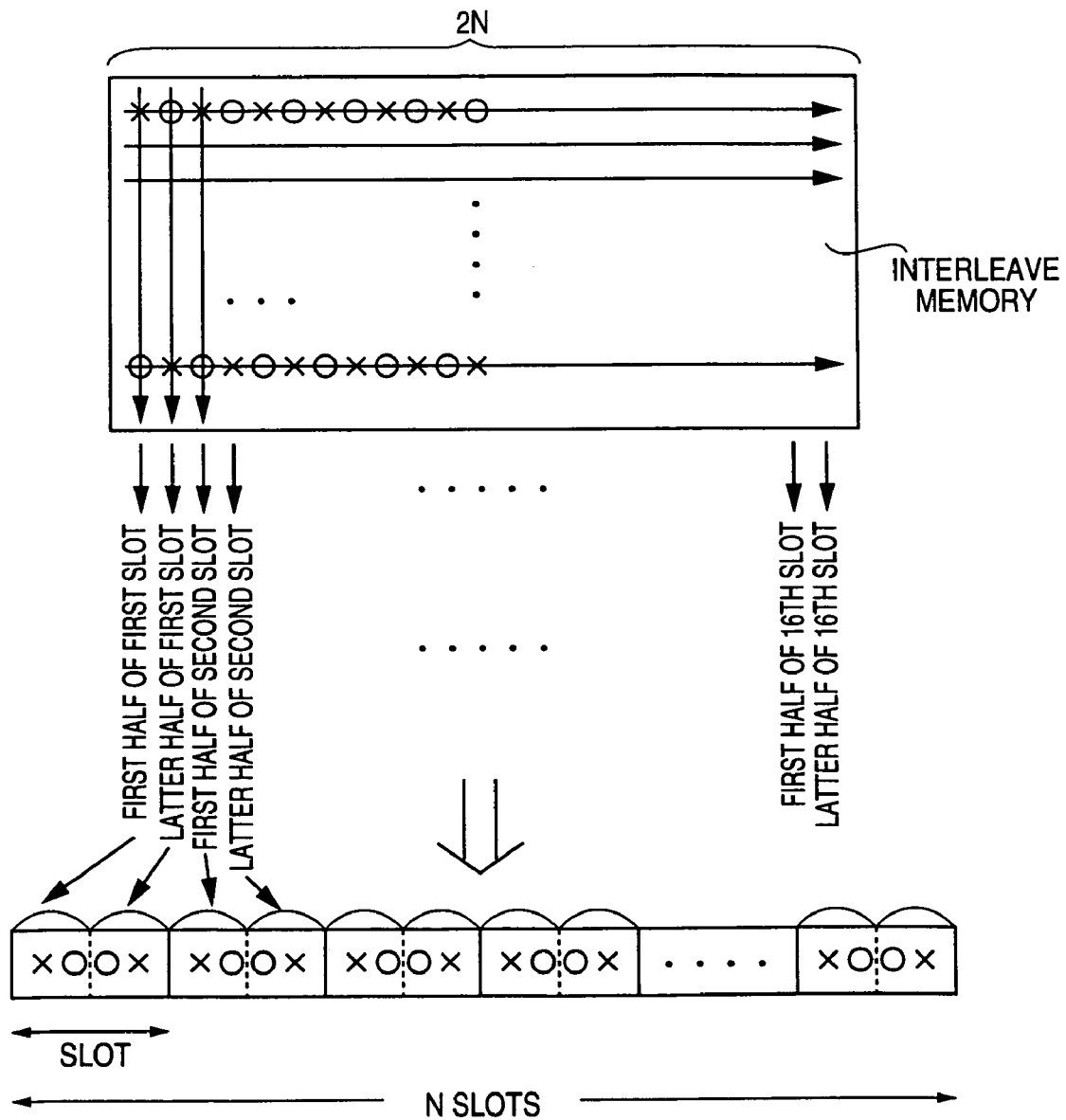
FIG. 18 is a figure for explaining an interleaving process in the interleaving circuit 14 of the present invention.

To avoid the above problems, an interleaver in which the number of columns is twice as many as the number of slots of the frame is used in this embodiment as shown in FIG. 18. Accordingly, the first half of the first slot corresponds to the first column, the latter half of the first slot corresponds to the second column, the first half of the second slot corresponds to the third column, the latter half of the second slot corresponds to the fourth column, and the like. Thus, since the relationship between the slot and the interleaver becomes as mentioned above, when the data is deinterleaved, a deteriorated part and a not deteriorated part appear alternately in a frame so that bit quality in the frame is flattened. Therefore, the above-mentioned problems can be avoided.

In this example, when quality of the transmission line is bad, since the accuracy of the reference phase in the center part of the slot is improved, quality of the second data block DB2 becomes better than that of the first data block DB1. On the other hand, when the quality of the transmission line is good so that the accuracy of the reference phase is subject to fading characteristics, the accuracy of the reference phase in the part close to the pilot signals PS1, PS2 is improved comparing with that in the center part of the slot. In this case, the quality of the first data block DB1 becomes better than that of the second data block DB2. That is, even when the state of the transmission line varies, transmission quality of one of the first and second data blocks DB1, DB2 improves. In addition, as mentioned above, bit interleaving is performed on a plurality of slots. Therefore, accordion to this embodiment, transmission quality is not biased in a frame so that normal quality can be assured.

Figure 19:
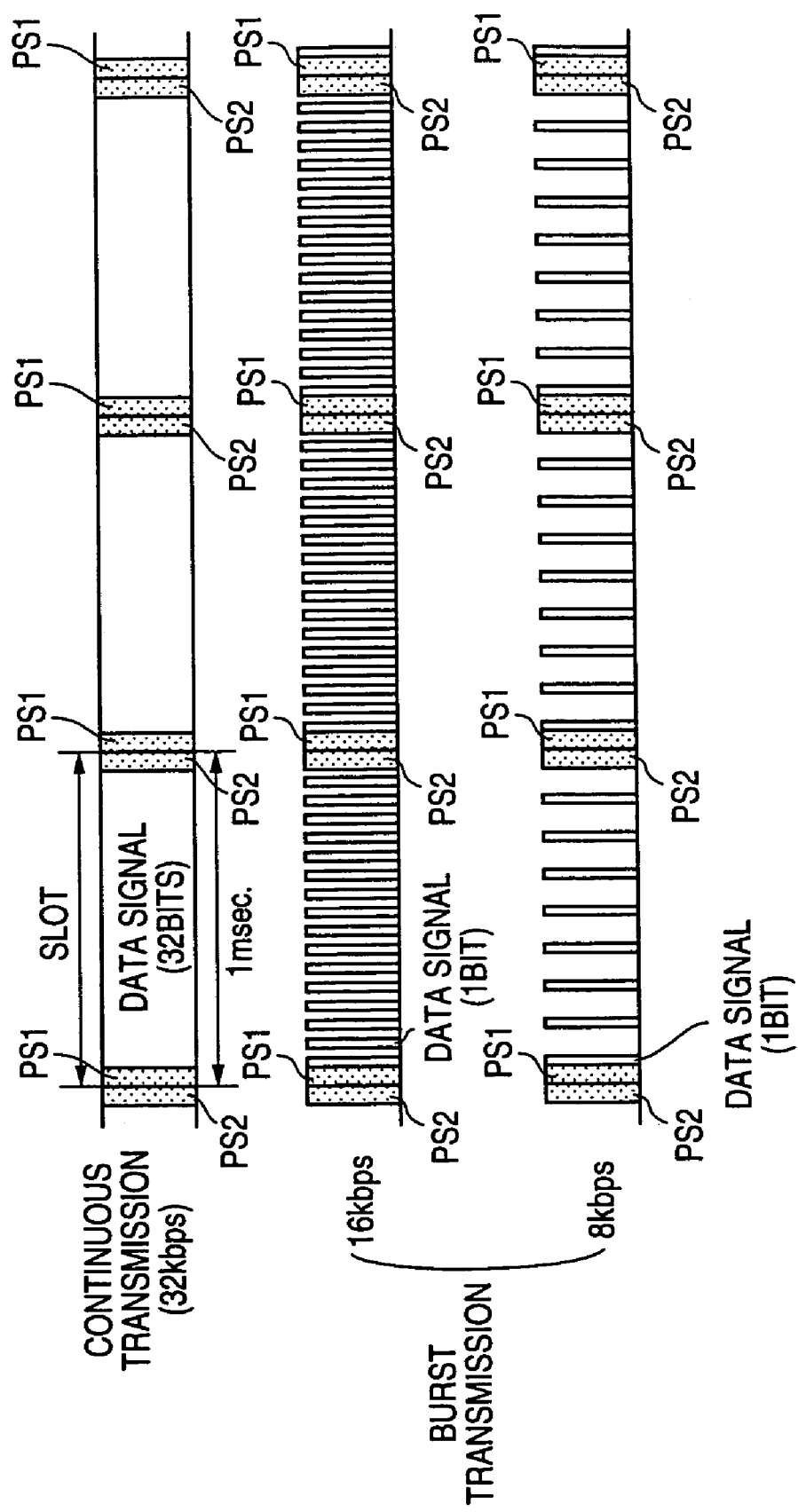
FIG. 19 shows second examples of slot configurations of an embodiment of the present invention.

Next, FIG. 19 shows a second example of slot configurations according to the embodiment of the present invention. The slot multiplexing circuit 15 relating to this embodiment may generate slots shown in FIG. 19 as well as slots shown in FIG. 16. In this case, when the data signal transmission rate is 16 kbps, the slot multiplexing circuit 15 divides the 16 bit data signals into eight parts each of which is one bit data block. These data blocks are placed spaced at regular intervals. Also when the data signal transmission rate is 8 kbps, one bit unit data blocks are generated and placed in predetermined positions as shown in FIG. 19 in the same way as when the transmission rate is 16 kbps.

Also in this case, the interleaving process in the interleave circuit 14 is performed by using the interleaver such as shown in FIG. 18. Therefore, data quality in a frame is not biased after deinterleaving. Thus, also in this case in which slots are configured as shown in FIG. 19, the transmission quality is not remarkably biased so that normal quality can be assured as the case of FIG. 16.

Figure 20:
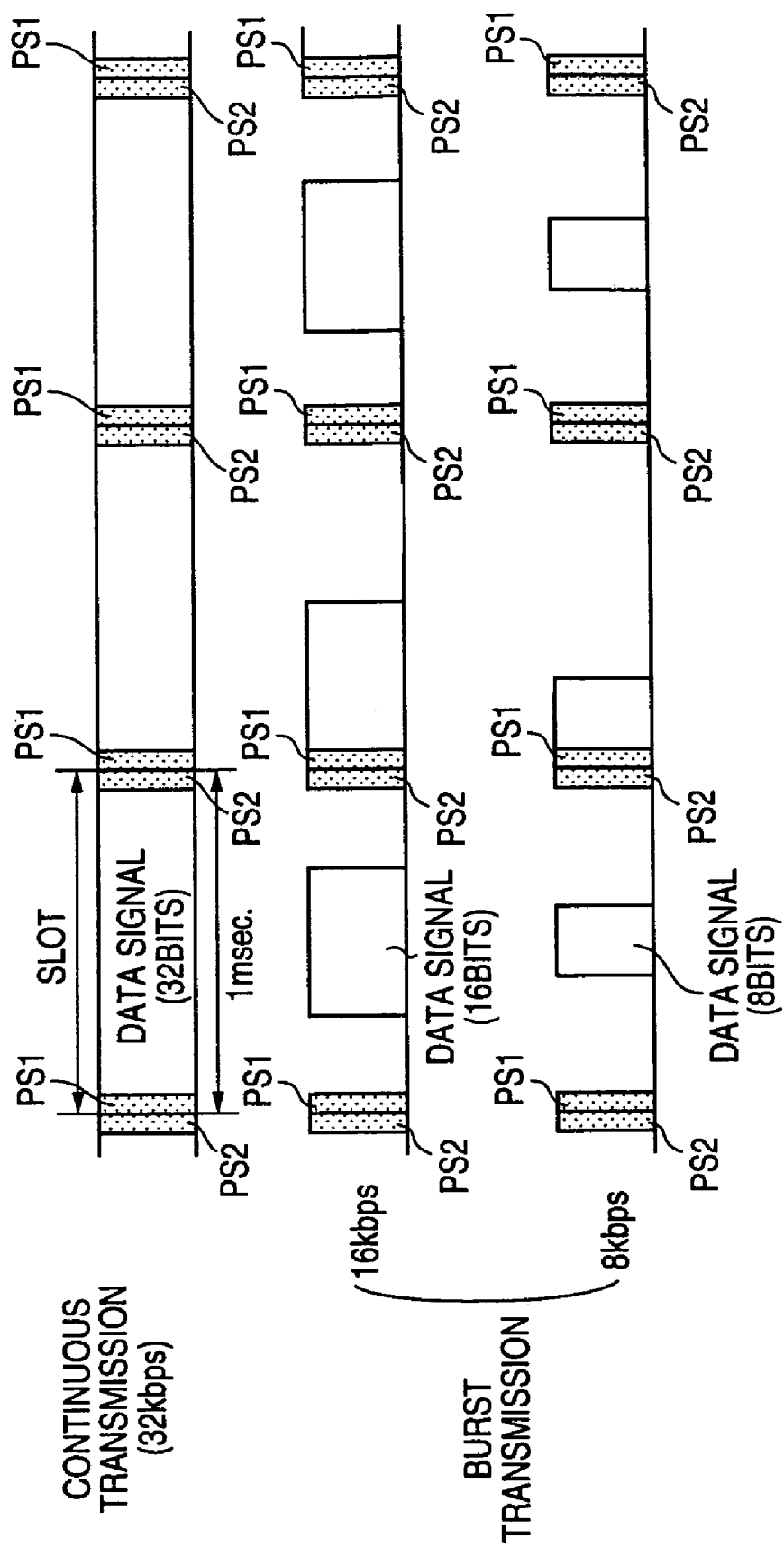
FIG. 20 shows third examples of slot configurations of an embodiment of the present invention.

FIG. 20 shows a third example of slot configurations according to the embodiment of the present invention. The slot multiplexing circuit 15 relating to this embodiment may generate slots shown in FIG. 20 as well as slots shown in FIGS. 16, 19. In this case, when the data signal transmission rate is 16 kbps or 8 kbps, the slot multiplexing circuit 15 places data signals in the center part of the first slot and places data signals to be adjacent to the first pilot signal PS1 in the next slot. After that, this placement is repeated so that whole slots are configured.

Also in this case, the interleaving process in the interleave circuit 14 is performed by using the interleaver such as that shown in FIG. 18. Therefore, data quality in a deinterleaved frame is not biased. Thus, since bit interleaving is performed over a plurality of slots also in this case, the data signal quality can be flattened whichever the transmission quality is high or low. When the transmission rate is 8 kbps, the data signals can be placed at each part of four equal parts into which a slot is divided.

Figure 21:
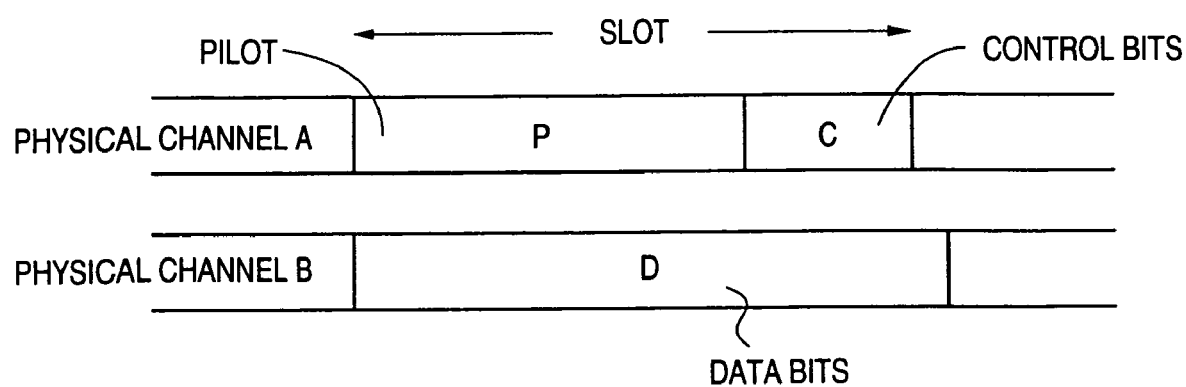
FIG. 21 is a figure for explaining parallel pilot transmission.

In the above-mentioned embodiment, the pilot signals are multiplexed in time. However as shown in FIG. 21, it is also possible that the pilot signal is transmitted by using a physical channel different from a physical channel used for data transmission (transmit the pilot signals and data separately) and the pilot signal is used for channel estimation of the same slot interval, wherein the channel estimation is estimation of the reference phase used for the synchronous detection.

In the following, an example corresponding to the third object of the present invention will be described, in which the data multiplexing method of the present invention is applied to the data transmitter shown in FIG. 15. This can be realized, for example, by replacing configuration parts 11~14 of the data transmitter 10 shown in FIG. 15 with the data multiplexer 30 and by adding necessary circuits. In this case, an interleaver in which the number of columns is twice as many as the number of slots per one frame is used as the second interleaver, and, randomization of the columns is performed.

Figure 22:
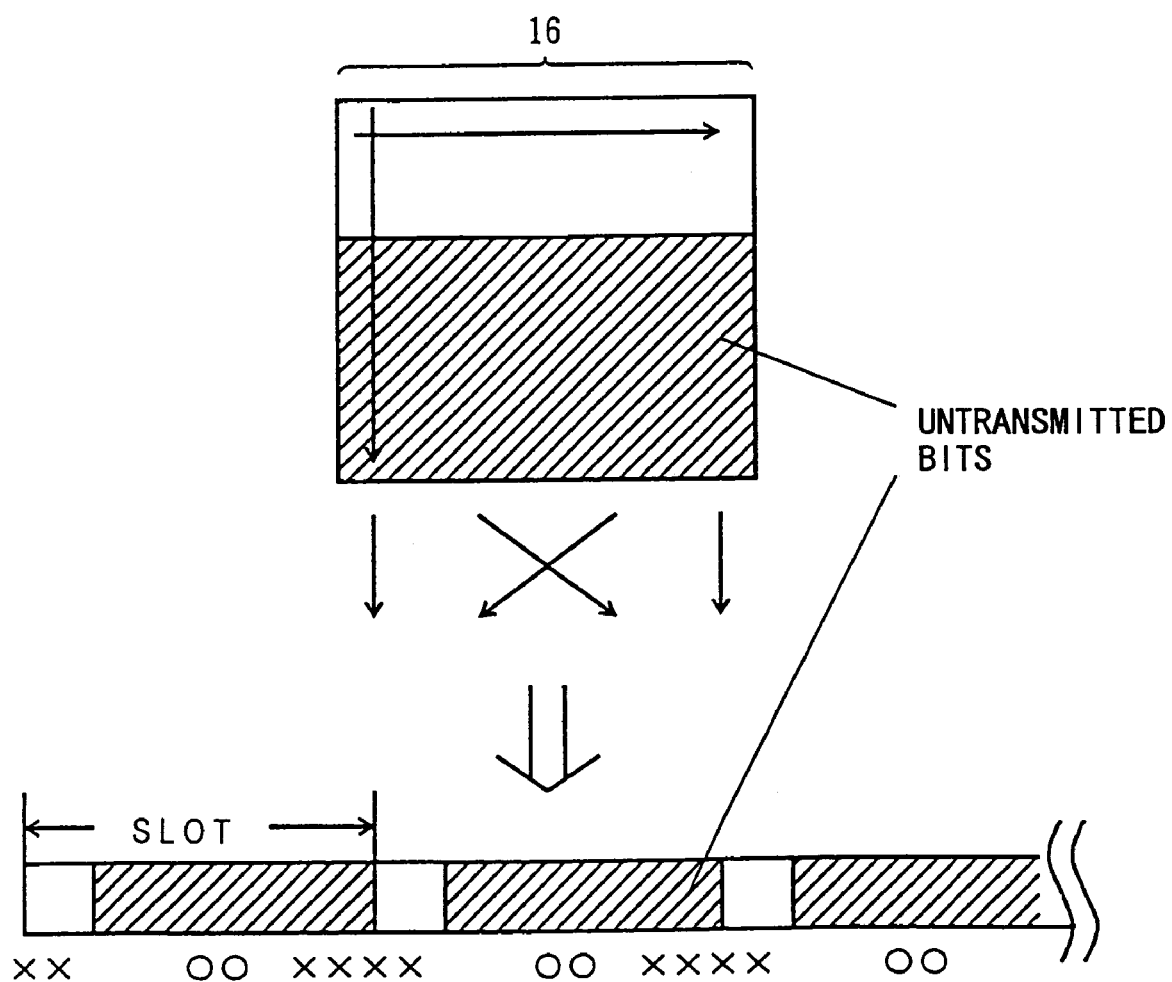
FIG. 22 is a figure for explaining an interleaving method in a case when combining the data multiplexer and the data transmitter of the present invention (problem when the number of columns is 16)

According to the configuration, following effects can be obtained, in which, when the number of bits of transmission data is small, bits are distributed uniformly in a frame, and, further, bit quality in the flame is flattened. That is, as shown in FIG. 22, when the number of columns is the same as that of slots, transmission bits are always placed in the forward part of each slot so that average bit error rate becomes large. On the other hand, as shown in FIG. 23, when the number of columns is twice the number of slots, transmission bits are placed in the edge and in the center parts of each slot so that average bit error rate can be smaller than that in the case shown in FIG. 22.

Figure 24:
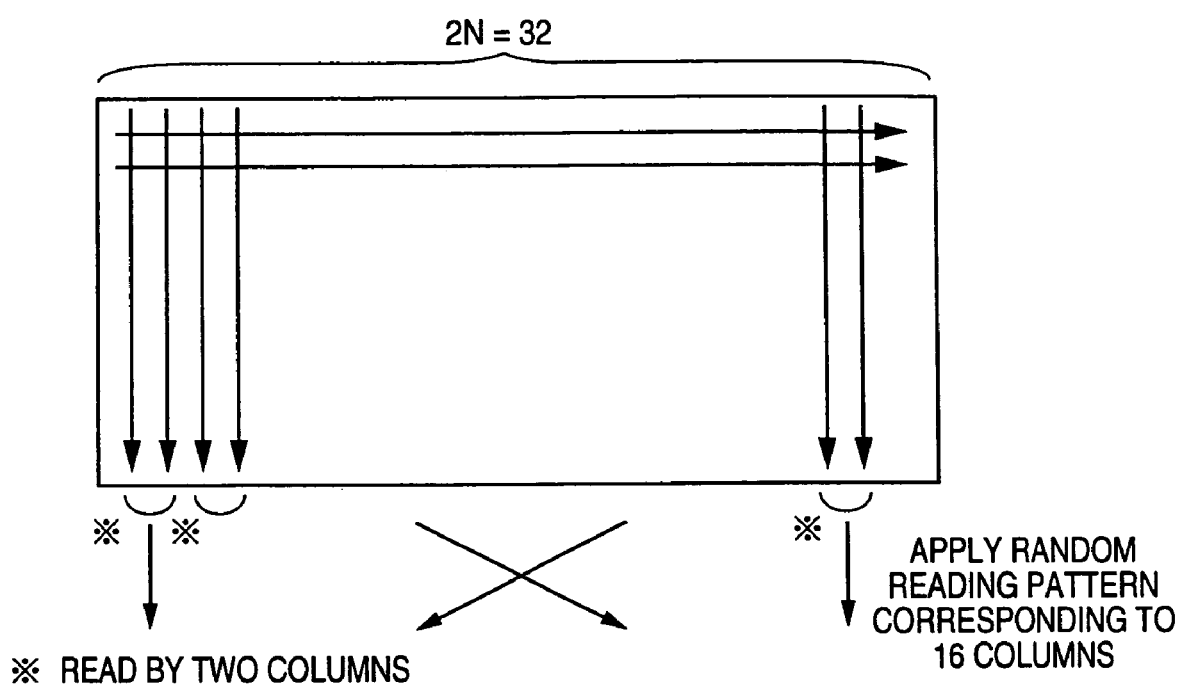
FIG. 24 is a figure for explaining an interleaving method in a case when combining the data multiplexer and the data transmitter of the present invention.

In addition, by performing an interleaving process shown in FIG. 24, following effects can be obtained regardless of the number of transmission data bits per one frame. That is, bits can be distributed uniformly in the frame and bit quality in the frame can be flattened.

Figure 23:
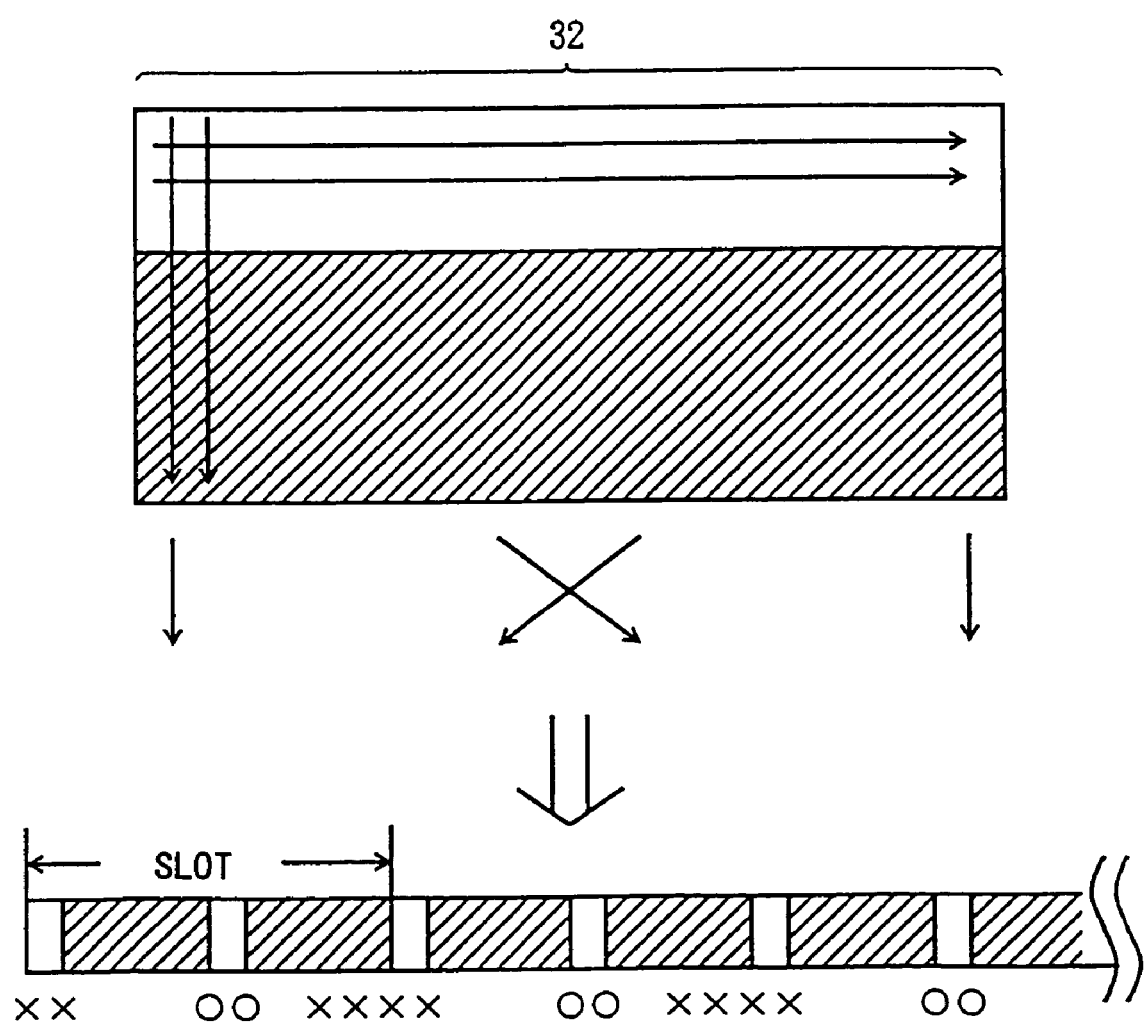
FIG. 23 is a figure for explaining an interleaving method in a case when combining the data multiplexer and the data transmitter of the present invention (effect when the number of columns is 32)

In FIGS. 22~24, cases in which one frame=16 slots and the number of columns=32 are shown. However, the same effect can be obtained when one frame=15 slots, and the number of columns=30.

Figure 25:
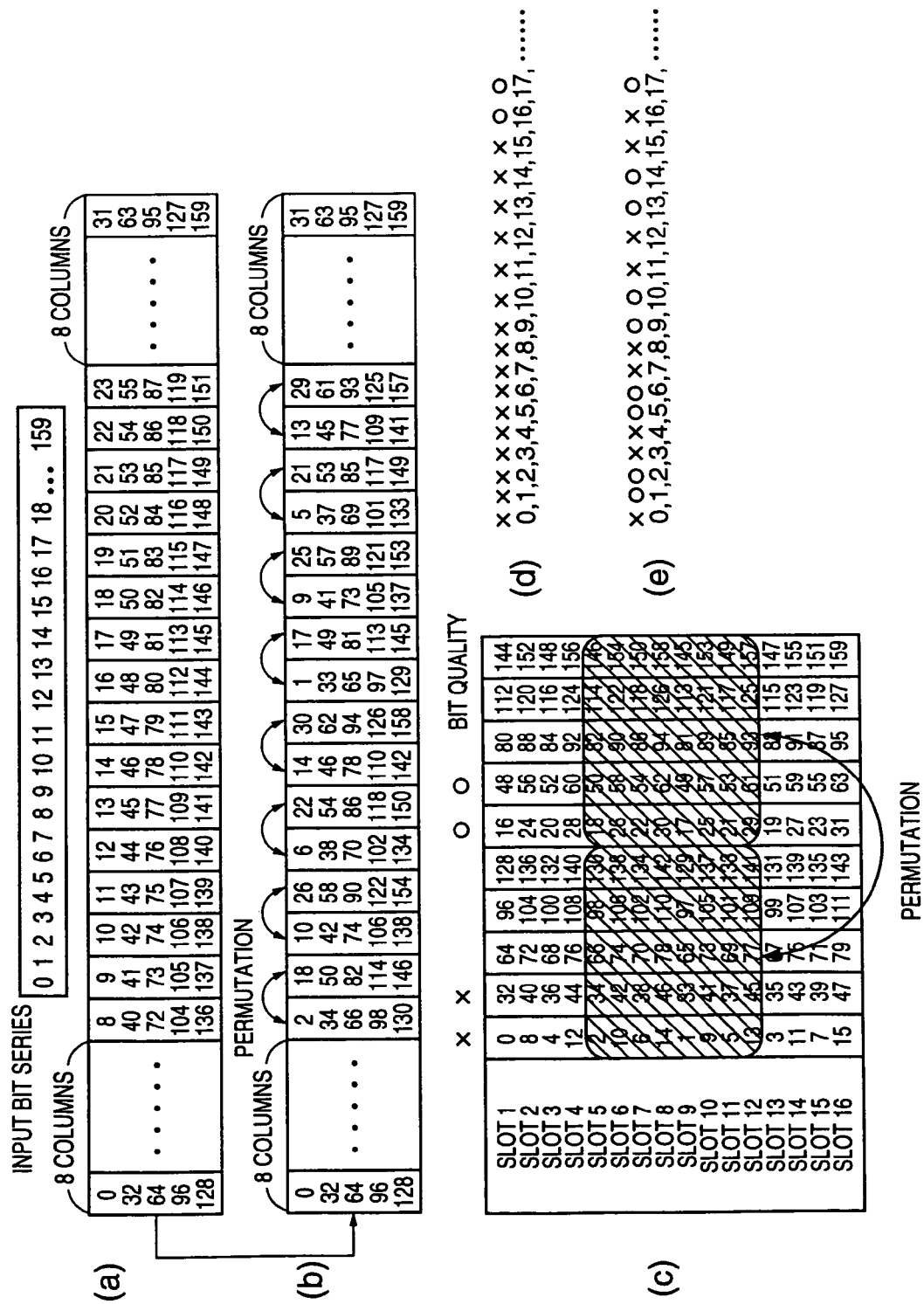
FIG. 25 is a figure for explaining a method of performing partial permutation of columns in an interleaving method in a case when combining the data multiplexer and the data transmitter of the present invention (when 1 frame=16 slots)

In addition, when one frame=16 slots and the number of columns=32, it becomes possible to further improve the effect of flattening bit quality in a frame by performing partial permutation of columns in an interleaver as shown in FIG. 25.

More particularly, according to this operation, columns of the 32 column interleaver shown in FIG. 25($a$) are randomized so that the interleaver becomes as shown in (b). Then, parts of columns as shown in (b) are permutated. (c) shows a state in which data in the randomized interleaver is mapped to each slot. The above permutations corresponds to permutations which are indicated by the diagonally shaded areas in (c). ○ and × shown in (c), indicate quality of corresponding bit positions in each slot.

If such permutation is not performed, deinterleaved data becomes a bit sequence shown in FIG. 25($d$) in which adjacent bits do not become ○× alternately, instead, ○ changes to × and vice versa every 15 bits so that the effect of flattening bit quality can not be obtained even after error correction decoding.

On the other hand, when the permutation is performed, the bit sequence becomes as shown in FIG. 25($e$) in which ○ and × appear alternately every two bits. According to the change between ○ and × every two bits, an effect which is very close to an effect when ○ and × are changed bit by bit can be obtained.

In the above permutation operation, since locations for permutation operation are selected such that distribution of average distances between bits is not changed, bits of a channel are not biased in a frame so that an effect of maximizing error correction ability by channel coding can be obtained.

In the following, a case when the number of slots per one frame is 15 will be described. When the number of slots per one frame is 15, it is possible to obtain the above both effects of flattening bit quality and distributing bits by setting the number of columns of an interleaver to 30. In this case, there is a method in which the above-mentioned permutation is not performed. In the method, a process shown in FIG. 26 as an example are performed by using a randomizing pattern ($C_0$, $C_{10}$, $C_{20}$, $C_4$, $C_{14}$, $C_{24}$, $C_8$, $C_{18}$, $C_{28}$, $C_2$, $C_{12}$, $C_{22}$, $C_6$, $C_{16}$, $C_{26}$, $C_1$, $C_{11}$, $C_{21}$, $C_5$, $C_{15}$, $C_{25}$, $C_9$, $C_{19}$, $C_{29}$, $C_3$, $C_{13}$; $C_{23}$, $C_7$, $C_{17}$, $C_{27}$) for 30 columns.

Figure 26:
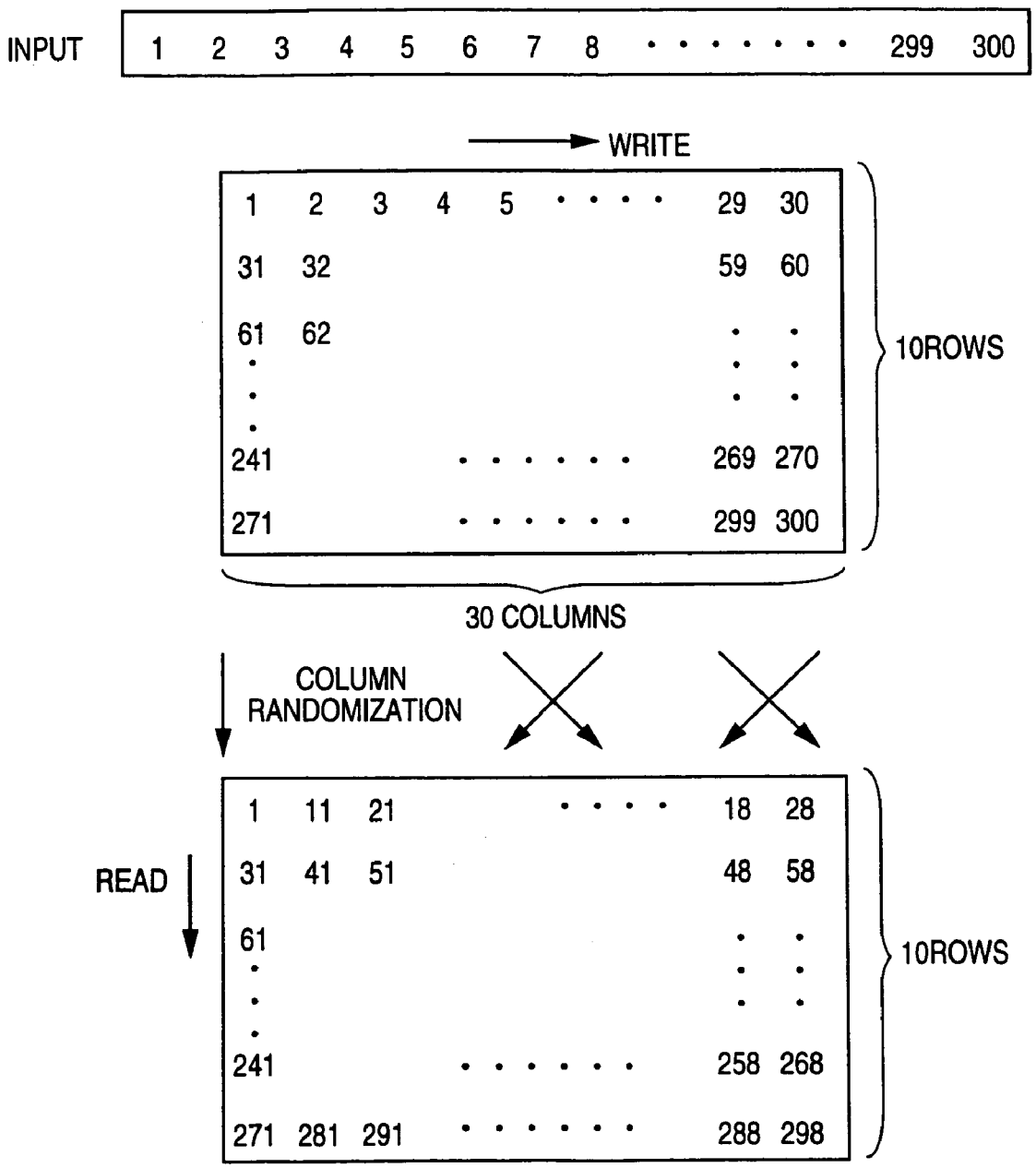
FIG. 26 is a figure for explaining an interleaving method in a case when combining the data multiplexer and the data transmitter of the present invention (when 1 frame=15 slots)
Figure 27:
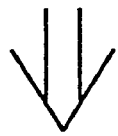
FIG. 27 shows a state in which interleaved data is mapped into each slot when 1 frame=15 slots.

By performing the interleaving process shown in FIG. 26, a state after interleaved data is mapped into each slot becomes as shown in FIG. 27. Data placement after deinterleaving becomes as shown in (a) when bit quality is as shown in FIG. 27. That is, ○× are changed every one bit to two bits. Therefore, the above both effects can be obtained.

Figure 28:
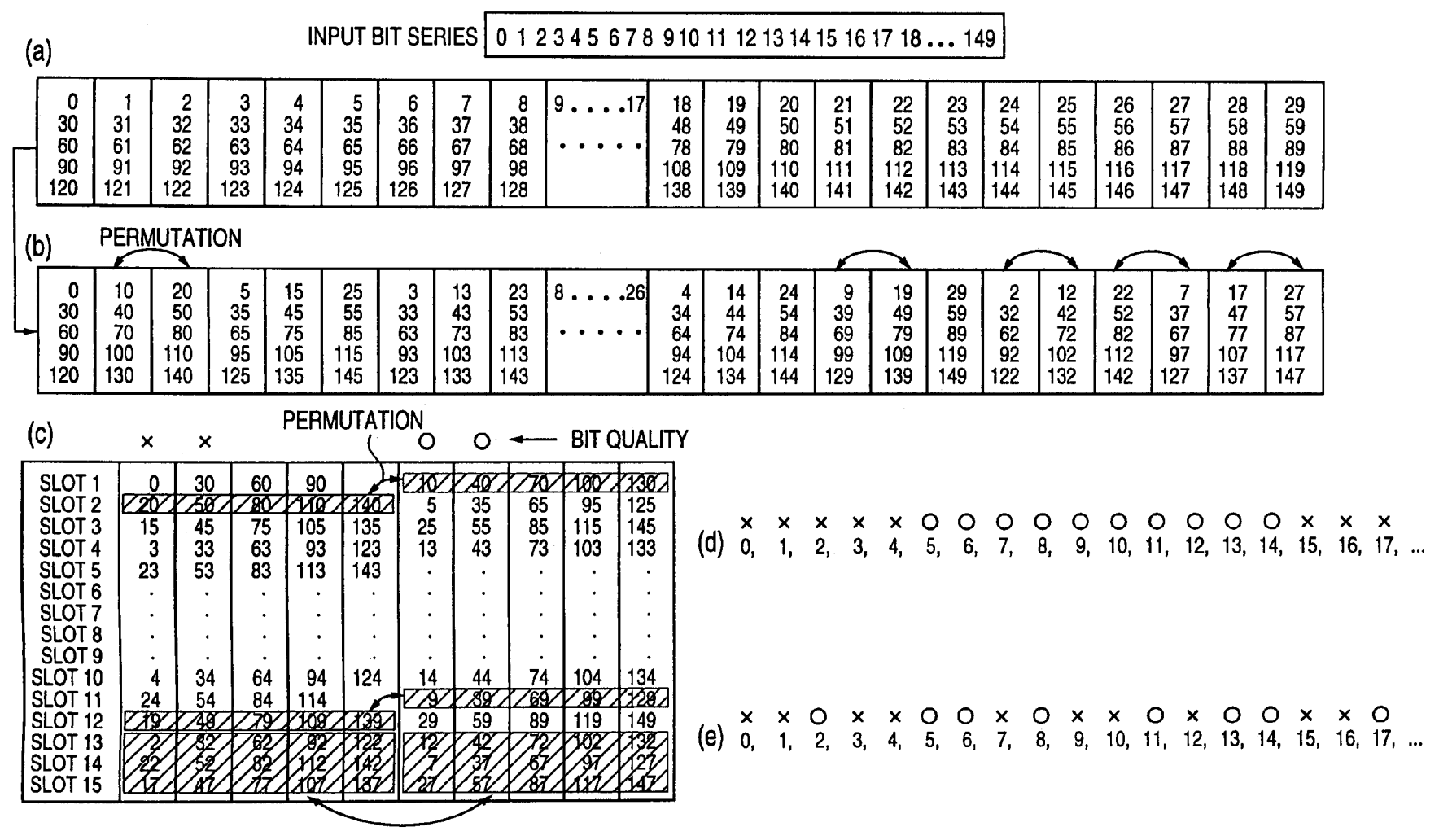

In the case when one frame=15 slots, a method of permutation operation is as shown in FIG. 28.

First, columns of the 30 column interleaver shown in FIG. 28($a$) are randomized. For this randomization, the interleave pattern for 30 columns shown in FIG. 11 is used. For the columns shown in (b) which has been randomized, parts which are shown in the figure are permutated. (c) shows a state in which data in the randomized interleaver is mapped into each slot. The above permutations corresponds to permutations indicated by diagonally shaded areas in (c). ○ and × in (c) indicate quality of corresponding bit locations in each slot.

If such permutation is not performed, deinterleaved data becomes a bit sequence shown in FIG. 28($d$) in which adjacent bits do not become ○× alternately so that the effect of flattening bit quality can not be obtained even after error correction decoding.

On the other hand, when the permutation is performed, the bit sequence becomes as shown in FIG. 28(e). Accordingly, an effect which is very close to an effect when ○ and × are changed bit by bit can be obtained.

The above-mentioned randomizing process can be performed by using a pattern ($C_0$, $C_{20}$, $C_{10}$, $C_5$, $C_{15}$, $C_{25}$, $C_3$, $C_{13}$, $C_{23}$, $C_8$, $C_{18}$, $C_{28}$, $C_1$, $C_{11}$, $C_{21}$, $C_6$, $C_{16}$, $C_{26}$, $C_4$, $C_{14}$, $C_{24}$, $C_{19}$, $C_9$, $C_{29}$, $C_{12}$, $C_2$, $C_7$, $C_{22}$, $C_{27}$, $C_{17}$) in which columns have been permutated.

In the above permutation operation, since locations for permutation operation are selected such that distribution of average distances between bits is not changed, bits of a channel are not biased in a frame so that an effect of maximizing error correction ability by channel coding can be obtained.

When one frame is 16 slots, above both effects are obtained by setting the number of columns of the interleaver as 32 and by performing the partial permutation of columns. When one frame is 15 slots, the both effects can be obtained only by setting the number of columns of the interleaver as 30. As is evident from this, by performing the partial permutation of columns as necessary according to the number (twice the number of slots) of columns of the interleaver which is decided from the number of slots per one frame, the both effects of flattening bit quality and distributing bits can be obtained As mentioned above, according to the data multiplexer of the present invention, even when the number of channel bits which are multiplexed is small, bits are mapped into whole frame and the error correction ability by channel coding is exerted at the maximum. In addition, since an interleaver common to each channel is used, the hardware scale can be decreased.

Further, as for interleavers used in the data multiplexer of the present invention, the number of columns of the first interleaver is decided when the interleaving span is decided, and the number of columns of the second interleaver can be set as the number of slots of the frame or an integral multiple of the number of slots of the frame. When the number of columns is decided, the pattern is decided. Therefore, according to the present invention, the number of patterns which needs to be decided can be decreased. Further, since the number of columns of the second interleaver can be set as the number of slots of the frame or an integral multiple of the number of slots of the frame (when one frame is 15 slots, 15 or an integral multiple of 15, and, when one frame is 16 slots, 16 or an integral multiple of 16), the pilot symbol and data bits can be placed continuously. Therefore, the apparatus can be simplified comparing with other methods.

Further, according to the data transmitting method of the present invention, since data is distributed in a slot and an interleaving method suitable for the distributed placement is used, data transmission error rate can be decreased, and, bit quality in a frame can be flattened.

Furthermore, since the partial permutation of columns is performed as necessary according to the number of columns of the interleaver, an apparatus which has the both effects of the data multiplexing method and the data transmitting method of the present invention can be provided.

The present invention is not limited to the specifically disclosed embodiments, and variations and modifications may be made without departing from the scope of the invention.

What is claimed is:

1. A method for interleaving multiplexed symbols and for transmitting a frame including slots holding at least a portion of the interleaved symbols, the method comprising:
    storing the multiplexed symbols in groups in a memory, each group having F symbols, wherein F is N times a number of the slots in said frame and N is an integer larger than 1;
    reading out the stored symbols from the memory and arranging the symbols read out from the memory into said slots, wherein the reading out step includes reading out a symbol from a same predetermined position in each group, and repeating the reading out step until all of the stored symbols are read out from the memory; and
    transmitting said slots on a physical channel different from a channel on which a pilot signal is transmitted.

2. The method as claimed in claim 1, further comprising:
    determining each predetermined position according to a predetermined rule.

3. The method as claimed in claim 1, wherein the reading out step comprises:
    arranging at least a portion of said interleaved symbols in at least at an end part of a slot and at a center part of the slot.

4. The method of claim 1, further comprising:
    spread spectrum modulating the symbols in said slots.

5. A transmitter for transmitting interleaved multiplexed signals in an output data frame having a plurality of slots, the transmitter comprising:
    a coder configured to encode content data into multiplexed symbols;
    a memory configured to store the multiplexed symbols in groups, each group having F symbols, wherein F is N times a number of the slots in said frame and N is an integer larger than 1;
    an output data frame formatting mechanism configured to read out the stored symbols from the memory and to arrange the symbols read out from the memory into said slots, wherein the output data frame formatting mechanism is configured to read out a symbol from a same predetermined position in each group, and to repeatedly read out the symbols until all of the stored symbols are read out from the memory; and
    a circuit configured to modulate the arranged symbols in said slots, and to modulate a pilot signal transmitted on a physical channel different from a physical channel used to transmit said slots.

6. The transmitter as claimed in claim 5, further comprising:
    an interleaving mechanism configured to determine each predetermined position according to a predetermined rule.

7. The transmitter as claimed in claim 5, wherein said output data frame formatting mechanism is configured to arrange at least a portion of said read out symbols in at least at an end part of a slot and at a center part of the slot.

8. The transmitter as claimed in claim 5, wherein said coder is configured to spread spectrum modulate the symbols in said slots.

* * * * *